United States Patent [19]
Fuse et al.

[11] Patent Number: 6,084,453
[45] Date of Patent: Jul. 4, 2000

[54] CLOCK CONVERTING CIRCUIT

[75] Inventors: Tsuneaki Fuse, Tokyo; Masahiro Kamoshida, Yokohama; Haruki Toda, Yokohama; Yukihito Oowaki, Yokohama, all of Japan

[73] Assignee: Kabushiki Kaisha Toshiba, Kawasaki, Japan

[21] Appl. No.: 09/105,959

[22] Filed: Jun. 29, 1998

[30] Foreign Application Priority Data

Jun. 30, 1997 [JP] Japan ................................. 9-174679

[51] Int. Cl.$^7$ ....................................... H03K 7/08
[52] U.S. Cl. ......................... 327/176; 327/271; 327/284
[58] Field of Search .................................. 327/172–176, 327/261, 269, 271, 284, 291, 295, 296, 31, 38, 113, 114, 276, 277, 141, 152, 153, 161, 166

[56] References Cited

U.S. PATENT DOCUMENTS

| | | | |
|---|---|---|---|
| 4,634,984 | 1/1987 | Harwood et al. ........................ | 327/31 |
| 5,699,003 | 12/1997 | Saeki ....................................... | 327/261 |
| 5,708,382 | 1/1998 | Park ........................................ | 327/277 |

OTHER PUBLICATIONS

"A 2.5 ns Clock Access 250MH$_z$256Mb SDRAM with a Synchronous Mirror Delay", 1996 IEEE International Solid–State Circuits Conference, Technical Digest, pp. 374–375, T. Saeki et al. Date Feb. 1996.

*Primary Examiner*—Minh Nguyen
*Attorney, Agent, or Firm*—Finnegan, Henderson, Farabow, Garrett & Dunner, L.L.P.

[57] ABSTRACT

A cycle measuring circuit 3 measures a cycle of an external clock signal, which is approximately m times a unit time. A number converting circuit 5 and a time converting circuit 7 cooperate, generating a pulse signal delayed by m/$2^K$ times the unit time, or by 1/$2^K$ times the cycle of the external clock signal. A logic circuit 8 generates an internal clock signal which rises in synchronism with the external clock signal and falls in synchronism with the pulse signal thus delayed. Hence, the internal clock signal has the same cycle as the external clock signal and has a desired duty ratio of (1/$2^K$)× 100%.

14 Claims, 17 Drawing Sheets

_(continued)_

CLOCK CONVERTING CIRCUIT

BACKGROUND OF THE INVENTION

The present invention relates to a semiconductor integrated circuit for generating an internal clock signal of a desired duty ratio from an external clock signal of any other duty ratio.

Generally, microprocessors and memory LSIs are designed to perform one-step operation in synchronism with each clock signal supplied from an external device. In other words, they perform one step of operation to receive a command, processing numerical data, input data or output data, at the rising edge or falling edge of one clock signal. Similarly, a synchronous memory, represented by a synchronous DRAM, writes data and reads data at the rising edge or falling edge of a clock signal supplied from an external device.

FIG. 1 illustrates a synchronous LSI 17. The LSI 17 receives an external clock signal EXCLK. In the LSI 17, a receiver 18 (i.e., input buffer) shapes the waveform of the signal EXCLK and amplifies the signal EXCLK, thereby generating a signal INCLK. The signal INCLK is used as an internal clock in the LSI 117.

FIG. 2A shows the waveform of an external clock signal EXCLK having a duty ratio of 50%, or a pulse duration of T/2, where T is the cycle of the signal EXCLK. Also shown in FIG. 2A is the waveform of an internal clock signal INCLK that the receiver 18 has generated from the external clock signal EXCLK. The internal clock signal INCLK is completely in phase with the external clock signal EXCLK if the delay time of the receiver 18 is neglected.

In recent years, microprocessors and synchronous memories that perform two steps of operation in synchronism with one external clock have come into use in increasing numbers, because they can operate fast. Namely, they perform one step at the rising edge of one clock signal and another step at the falling edge of the clock signal. Obviously, they operate twice faster than the microprocessors and synchronous memories designed to perform one step of operation in synchronism with one external clock signal of the same frequency. For such a microprocessor or synchronous memory it is desired that the internal clock signal have a duty ratio of 50%. The reason is as follows.

As seen from FIG. 2A, if the external clock signal EXCLK has a cycle T, the internal clock signal INCLK also has the same cycle T. Assume that a synchronous LSI (e.g., a microprocessor or a synchronous memory) needs time tp to perform one step of operation. Then, the cycle T must be at least 2 tp (T≧2 tp) to enable the synchronous LSI to perform two steps of operation in response to one internal clock signal INCLK. If the external clock signal EXCLK has a duty ratio of 33% as illustrated in FIG. 2B, the cycle T needs to be at least 3 tp (T≧3 tp) to enable the LSI requires to perform two steps in response to one external clock signal INCLK. This is why the internal clock signal INCLK should have a duty ratio of 50% to enable the LSI to operate at high speed.

Any external clock signal having a duty ratio other than 50% cannot enable a synchronous LSI to perform two steps of operation in response to one clock pulse at high speed.

A synchronous LSI of a special type may need an internal clock signal having a duty ratio of 25%. Hitherto, however, it has been difficult to generate an internal clock signal of a desired duty ratio, because the duty ratio of the internal clock signal totally depends upon the duty ratio of the external clock signal.

BRIEF SUMMARY OF THE INVENTION

The object of the present invention is to provide a semiconductor integrated circuit which can generate a clock signal having a desired duty ratio of $1/2^K \times 100\%$ (K is a natural number) from a clock signal of any other duty ratio.

According to an aspect of the invention there is provided a semiconductor integrated circuit, in which the cycle of a first pulse signal corresponding to a primary clock signal is measured as a value which is approximately m times a unit time. The first pulse signal is processed, generating a second pulse signal which is delayed with respect to the first pulse signal by $m/2^K$ times the unit time, or by $1/2^K$ times the cycle of the primary clock signal. The semiconductor integrated circuit comprises a logic circuit. The logic circuit generates a secondary clock signal which rises in synchronism with the first pulse signal and which falls in synchronism with the second pulse signal. The integrated circuit can generates from a primary clock signal of any duty ratio and any cycle a secondary clock signal which has a desired duty ratio and the same cycle as the primary clock signal.

According to another aspect of the invention there is provided a semiconductor integrated circuit, in which the cycle of a first pulse signal corresponding to a primary clock signal is measured as a value which is approximately m times a unit time. The first pulse signal is processed, generating a second pulse signal which is delayed with respect to the first pulse signal by $m/2^K$ times the unit time, or by $1/2^K$ times the cycle of the primary clock signal. Further, the first pulse signal is processed, generating a third pulse signal which is delayed with respect to the first pulse signal by $m/2^{K+1}$ times the unit time, or by $1/2^{K+1}$ times the cycle of the primary clock signal. The semiconductor integrated circuit comprises two logic circuits. The first logic circuit generates a secondary clock signal which rises in synchronism with the first pulse signal and which falls in synchronism with the second pulse signal. The second logic circuit generates a tertiary clock signal which rises in synchronism with the first pulse signal and which falls in synchronism with the third pulse signal. The integrated circuit can generates, from a primary clock signal of any duty ratio and any cycle, a secondary clock signal having a desired duty ratio and the same cycle as the primary clock signal and also a tertiary clock signal having a desired duty ratio and the same cycle as the primary clock signal.

According to still another aspect of the invention there is provided a semiconductor integrated circuit, in which a first pulse signal generated from a primary clock signal has the same cycle as the primary clock signal and is delayed by a first time with respect to the primary signal, and a secondary clock signal generated from a third pulse signal and a fourth pulse signal is delayed while passing through a buffer. The sum of the first delay time and the second delay time is compensated for, thereby generating a secondary clock signal which is in phase with the primary clock signal and which has a desired duty ratio.

According to another aspect of the invention there is provided a semiconductor integrated circuit, in which each pulse output circuit outputs a first pulse signal when the output of any one of two adjacent first delay elements and the output of a pulse generating circuit are at logic level "1," in response to the output of the nth first delay element. This pulse passes through n/2 or (n+1)/2 second delay elements and is output as a second pulse signal. That is, a pulse is delayed by the cycle of a primary clock signal while passing through the first delay elements connected in cascade, and is further delayed by half the cycle of the primary clock signal while passing through the second delay elements connected in cascade. Hence, the integrated circuit can generate a secondary clock signal which rises in synchronism with the first pulse signal and falls in synchronism with the second pulse signal, which has the same cycle as the primary clock signal and which has a duty ratio of 50%.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Preferred embodiments of the present invention will be described, with reference to the accompanying drawings.

The present invention relates to a semiconductor integrated circuit, such as an internal clock generating circuit, or a clock converting circuit, which generates an internal clock signal having a desired duty ratio of $1/2^K \times 100\%$ (K is a natural number) from a clock signal of any other duty ratio. This semiconductor integrated circuit is designed, generally for use in synchronous LSIs. Some of the embodiments described herein generate an internal clock signal which has a duty ratio of 50% (K=1) and which is regarded as highly serviceable. The other embodiments described herein generates an internal clock signal which has a duty ratio of 25% (K=2) and which is also regarded as greatly serviceable.

(First Embodiment)

Figure 1:
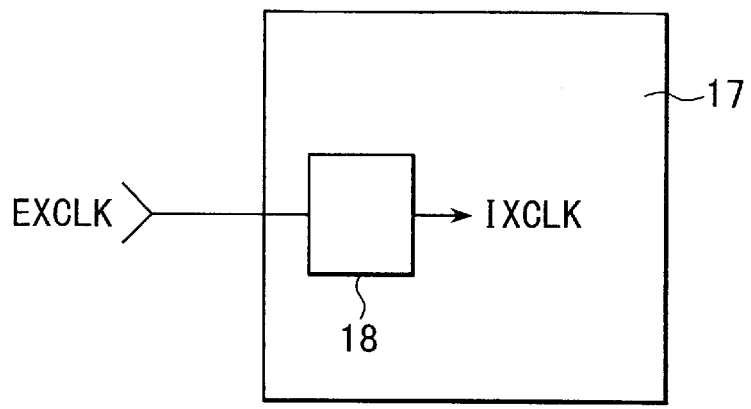
FIG. 1 a diagram showing a conventional synchronous LSI.
Figure 2A:
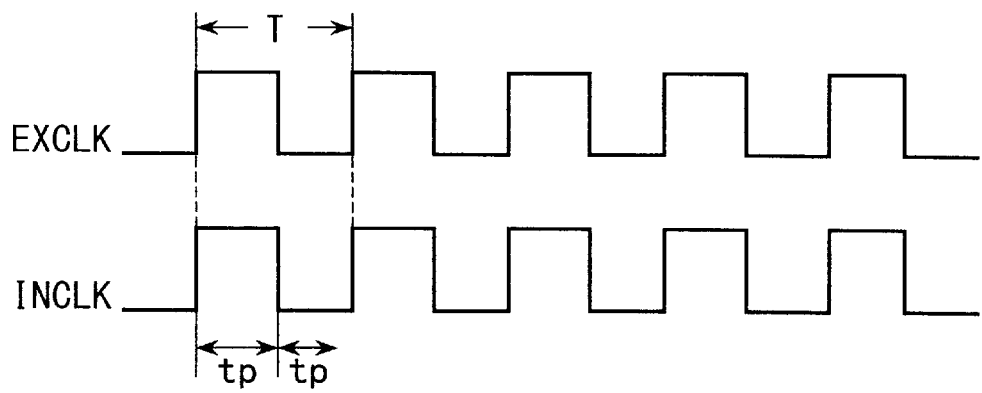
FIGS. 2A and 2B are timing charts for explaining the operation of the synchronous LSI shown in FIG. 1.
Figure 2B:
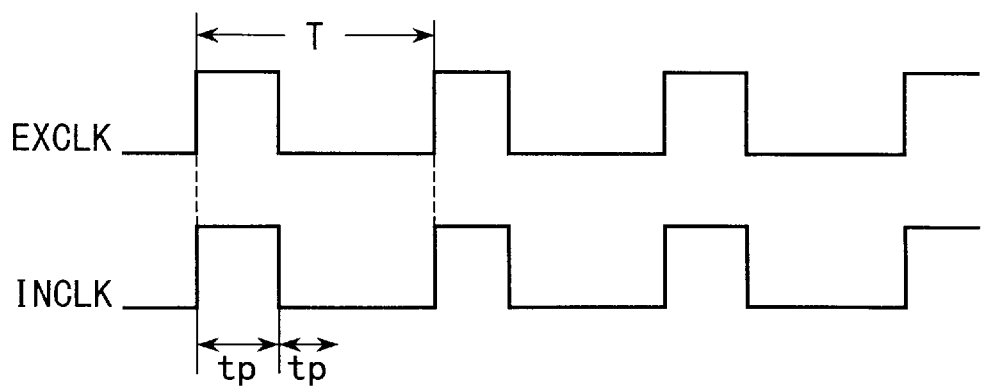
Figure 3:
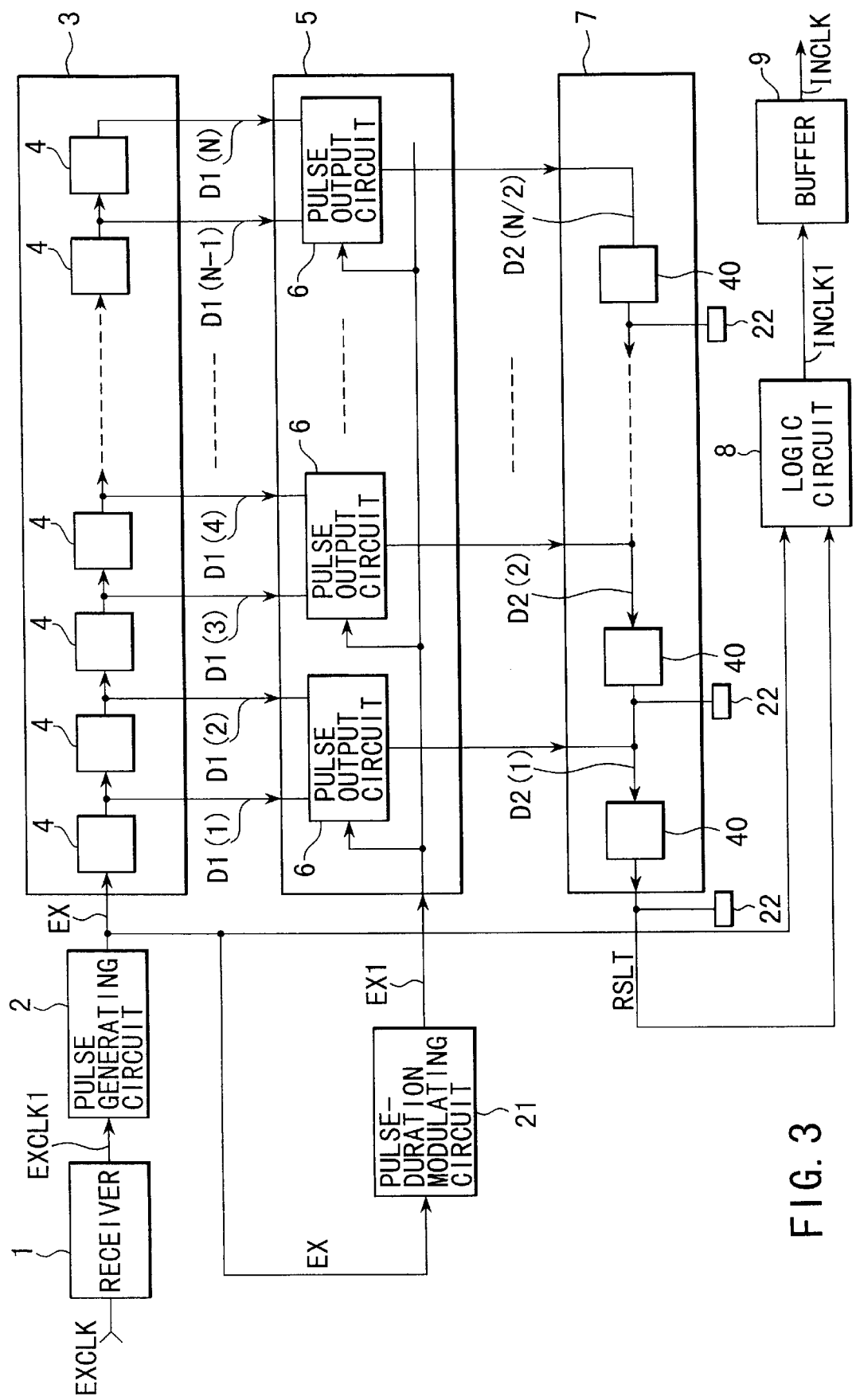
FIG. 3 is a block diagram showing a semiconductor integrated circuit according to a first embodiment of the invention.

The internal clock generating circuit, which is the first embodiment, can generate an internal clock signal having a duty ratio of 50% from an external clock signal of any other duty ratio. FIG. 3 shows the internal clock generating circuit according to the first embodiment.

As shown in FIG. 3, the internal clock generating circuit comprises a receiver 1, a pulse generating circuit 2, a cycle measuring circuit 3, a number converting circuit 5, a time converting circuit 7, a logic circuit 8, a buffer 9, a pulse-duration modulating circuit 21, and dummy load elements 22.

The receiver (input buffer) 1 shapes the waveform of an external clock signal EXCLK supplied from an external oscillator, generating an external clock signal EXCLK1. The pulse generating circuit 2 generates pulse signals EX (a pulse train) at the rising edges or falling edges of the clock signal EXCLK1 output from the receiver 1.

The cycle measuring circuit 3 has N delay elements 4 (first delay elements), for example 200 delay elements, in order to detect the number of delay elements through which each pulse signal EX passes within a time equal to its cycle. Thus, the circuit 3 measures the cycle of each pulse signal EX in terms of m times the unit time ($t_{unit}$). The delay elements 4 have the same delay time that is equal to the unit time ($t_{unit}$). The cycle measuring circuit 3 has N output terminals, which are connected to the outputs of the N delay elements 4, respectively. Each output terminal outputs a pulse D1(i) (1<i<N) which has been delayed by the product of the unit time ($t_{unit}$) and the ordinal number of the delay element 4 connected to the output terminal.

The number converting circuit 5 has N/2 pulse output circuits 6 in order to convert a parameter m to a parameter m/2. The parameter m represents the cycle of the external clock signal EXCLK1, which the cycle measuring circuit 3 has measured. The N/2 pulse output circuits 6 are connected to the output of the pulse generating circuit 2 by the pulse-duration modulating circuit 21. Each pulse output circuit 6 is connected to the outputs of two adjacent delay elements 4.

Each pulse output circuit 6 outputs a pulse D2 when at least one of the two delay elements 4 connected to the circuit 6 outputs a pulse D1 while the pulse-duration modulating circuit 21 is outputting a pulse EX1. More precisely, the circuit 6 obtains the logic product of the pulse EX1 supplied from the pulse-duration modulating circuit 21 and the pulse D1(j) (j=1, 3, 5, . . . ) supplied from one of the two delay circuits 4 and generates a pulse D2(j+1/2) if both pulses EX1 and D1(j) are at logic level "1." The circuit 6 also obtains the logic product of the pulse EX1 and the pulse D2(j+1) (j=1, 3, 5, . . . ) supplied from one of the two delay circuits 4 and generates a pulse D2((j+1)/2) (if both pulses EX1 and D1(j+1) are at logic level "1." The parameter m is j+1, that is, m=j+1.

The time converting circuit 7 has N/2 delay elements 40 (second delay elements) in order to convert the parameter m/2 to time. (The parameter m/2 has been supplied from the number converting circuit 5.)

The wiring connecting the cycle measuring circuit 3 and the time converting circuit 7 must be as simple possible. To this end, the delay elements 40 connected in cascade in the time converting circuit 7 are arranged on a synchronous LSI chip, close and parallel to the delay elements 4 connected in cascade in the cycle measuring circuit 3. Furthermore, the delay elements 40 are so arranged as to transfer signals in the direction opposite to the direction in which the delay elements 4 transfer signals.

The delay elements 40 incorporated in the time converting circuit 7 have a delay time equal to the unit time ($t_{unit}$). That is, they have the same delay time as the delay element 4 of the cycle measuring circuit 3. The time converting circuit 7 has one output terminal, which is connected to the output of the last-state delay element 40. The pulse D2(m) output from any pulse output circuit 6 passes through the m/2 delay elements 40 and is thereby delayed by m/2 times the unit time ($t_{unit}$). The pulse D2(m), thus delayed, is output as a pulse signal RSLT from the output terminal of the time converting circuit 7.

The dummy load elements (load circuits) 22 are connected to the outputs of the delay elements 40, respectively, to equalize the delay time of the elements 40 to that of the delay elements 4. Each dummy load element 22 has a capacitance equal to the difference between the input capacitance and output capacitance of the pulse output circuit 6.

The pulse signal RSLT has the same cycle as the pulse signal EX. It is delayed with respect to the pulse signal EX by ($t_{unit}$)×(m/2), i.e., half the cycle of the external clock signal EXCLK.

The logic circuit 8 generates an internal clock signal INCLK1 having the desired duty ratio of 50%, from the pulse signal EX and the pulse signal RSLT. To state more specifically, the logic circuit 8 starts generating each pulse of the internal clock signal INCLK1 at the rising edge of the pulse signal EX, and stops generating the pulse at the rising edge of the pulse signal RSLT. The internal clock signal INCLK1 acquires the desired duty ratio of 50%, because the pulse signal RSLT is delayed with respect to the pulse signal EX by half the cycle of the external clock signal EXCLK.

The internal clock signal INCLK1 thus generated is output through the buffer 9 as an internal clock signal INCLK.

Figure 4:
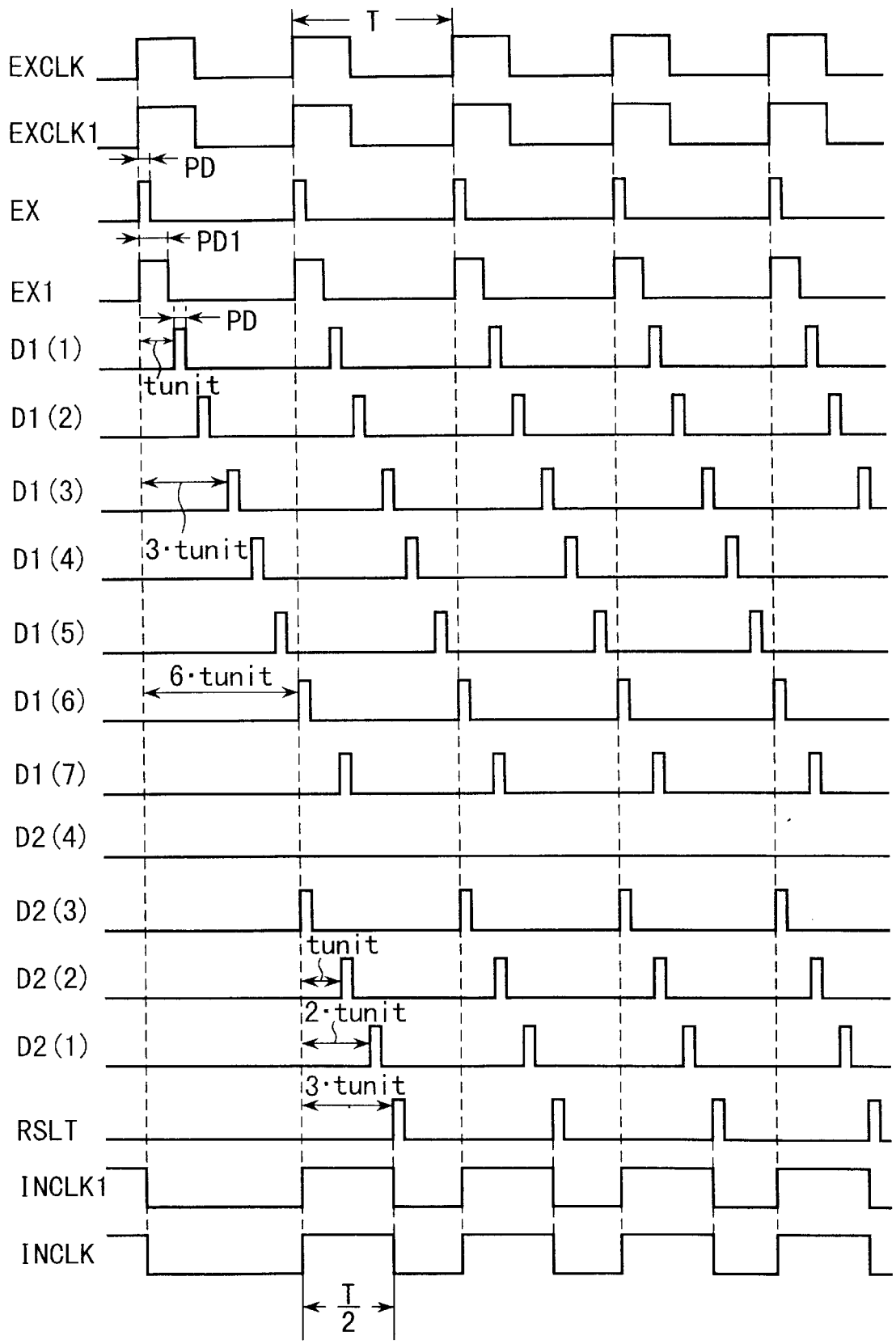
FIG. 4 is a timing chart explaining the operation of the circuit shown in FIG. 3.

FIG. 4 is a timing chart explaining the operation of the internal clock generating circuit illustrated in FIG. 3. As indicated above, the external clock signal EXCLK has a cycle T and a duty ratio of 33%. In order to illustrate the operation of the circuit, the delay times other than those of the delay elements 4 and 40 are neglected and not shown in the timing chart.

Since the delay time of the receiver 1 is neglected, the external clock signal EXCLK1 output from the receiver 1 is in phase with the external clock signal EXCLK supplied to the receiver 1. The pulse generating circuit 2 outputs a pulse signal EX at the rising edge of the clock signal EXCLK1. The pulse signal EX is supplied to the measuring circuit 3. Assume that each delay element 4 provided in the circuit 3 generates a pulse that is in phase with the input pulse. As shown in FIG. 4, the unit time $t_{unit}$ is T/6. The outputs D1(1) to D1(7) of the delay elements 4 are delayed by $t_{unit}$, $2 \times t_{unit}$, $3 \times t_{unit}$, $4 \times t_{unit}$, $5 \times t_{unit}$, $6 \times t_{unit}$, and $7 \times t_{unit}$, respectively, with respect to the pulse signal EX.

The pulse-duration modulating circuit 21 changes the duration of the pulse signal EX, generating a pulse signal EX1. The pulse signal EX1 is supplied to the pulse output circuit 6. The pulse output circuit 6 outputs a pulse D2((j+1)/2) when the pulse signal EX1 and one of the pulses D1(j) and D1(j+1) supplied from two associated delay elements 4 are at logic level "1." In the instance shown in FIG. 4, j=5 (m=6).

The pulse signal EX1 may rise and fall during the interval between the pulses D1(5) and D1(6) output from the fifth and sixth delay elements 4. In other words, the pulse signal EX1 may fail to overlap these pulses D1(5) and D1(6). If this is the case, the third pulse output circuit 6 does not outputs the pulse D2(3), making it impossible to measure the cycle of the external clock signal EXCLK1. To prevent this error, the pulse-duration modulating circuit 21 modulates the duration PD of the pulse signal EX so that the time PD1+PD (i.e., the sum of the duration PD1 of the pulse signal EX1 and the duration PD of the pulse D1 output from any delay element 4) may be longer than the unit time $t_{unit}$. Since the duration PD of the pulse signal EX is so modulated, the pulse signal EX1 overlaps either the pulse D1(j) or pulse D1(j+1) output from the delay elements 4. As a result, the third pulse output circuit 6 would not fail to output the pulse D2(3).

The number converting circuit 5 converts the number m thus measured, to a parameter m/2, and generates a pulse D2(m/2). The pulse D2(m/2) is input to the (m/2)th delay element 40 of the time converting circuit 7. In the circuit 7, the pulse D2(m/2) passes through m/2 delay elements 40. The pulse D2(m/2) is therefore delayed (m/2)×$t_{unit}$ and then output from the time converting circuit 7. Since m=6 in the instance of FIG. 4, the pulse D2(3) is completely in phase with the pulse D1(6). The pulse D2(3) passes through three delay elements 40 and is output as the pulse signal RSLT from the time converting circuit 7. Hence, the pulse signal RSLT is delayed by 3×$t_{unit}$ with respect to the pulse signal EX.

The logic circuit 8 generates an internal clock signal INCLK1 that changes when either the pulse signal EX or the pulse signal RSLT output from the time converting circuit 7 takes logic level "1." Since the pulse signal RSLT is delayed by half the cycle T with respect to the pulse signal EX, the internal clock signal INCLK1 has a duty ratio of 50%. An internal clock signal INCLK having a duty ratio of 50% can therefore be generated if the delay time of the buffer 9 is neglected.

The pulse signal EX is generated at the rising edge of the internal clock signal INCLK1. Instead, the signal EX may be generated at the falling edge of the internal clock signal INCLK1.

The cycle T may be measured as an odd number times the unit time $t_{unit}$. That is, both the pulse EX and any odd-numbered pulse D1 are at logic level "1." If so, the duty ratio of the internal clock signal INCLK will have an error corresponding to the unit time $t_{unit}$. To minimize this error, the unit time $t_{unit}$ is much shorter than the minimum cycle Tmin for the various external clock signals that are used in general (Tmin>>$t_{unit}$), and 100 or 200 delay elements 4 are used in the cycle measuring circuit 3. The circuit 3 can therefore measure the cycle of any external clock signal at the fortieth pulse D1 or any other pulse generated later. The error can be then reduced to about 1%, thereby enabling the internal clock signal INCLK to be used in practice.

In the internal clock generating circuit of FIG. 3, a pulse signal EX having the same cycle as the external clock signal EXCLK is input to the cycle measuring circuit 3. The circuit 3 detects the number of delay elements 4 through which the pulse signal EX passes within the time equal to its cycle. Thus, the circuit 3 measures the cycle of the pulse signal EX to be m times the unit time $t_{unit}$. The number converting circuit 5 converts the number of delay elements 4 detected by the circuit 3, into a half. The output of the circuit 5, which represents half the number of elements 4, is supplied to the time converting circuit 7. The circuit 7 converts the output of the circuit 5 to half the cycle of the pulse signal EX and generates a pulse signal RSLT having a cycle equal to half the cycle of the pulse signal EX. From the pulse signal RSLT, an internal clock signal INCLK having a duty ratio of 50% is generated.

As mentioned above, the cycle measuring circuit 3 detects the number of delay elements 4 through which the pulse signal EX has passes within the time equal to its cycle, thus converting the cycle of the pulse signal EX into the number of delay elements 4. Conversely, the time converting circuit 7 converts the number of delay elements into a time. The delay elements 4 provided in the cycle measuring circuit 3 and the delay elements 40 provided in the time converting circuit 7 are identical in structure and can therefore have the same delay time. The time converting circuit 7 can therefore generates a pulse signal RSLT which has exactly half the cycle measured by the cycle measuring circuit 3.

The delay elements 40 of the time converting circuit 7 are arranged on the synchronous LSI chip, close to the delay elements 4 of the cycle measuring circuit 3. This helps to impart the same delay time to all these delay elements 4 and 40, even if the delay elements 4 and 40 differ in size due to process variation. It is desired that the elements 40 be located as close as possible to the elements 4. In view of this, any other component, but the number converting circuit 5, should not be provided between the array of elements 4 and the array of elements 40.

In the first embodiment, the delay elements 40 are so arranged as to transfer signals in the direction opposite to the direction in which the delay elements 4 transfer signals. This serves to simplify the arrangement of wires that connect the cycle measuring circuit 3 and the time converting circuit 7 must be as simple possible.

The pulse generating circuit 2, delay elements 4, delay elements 40, pulse output circuits 6 and logic circuit 6 will be described in detail.

Figures 5A, 5B:
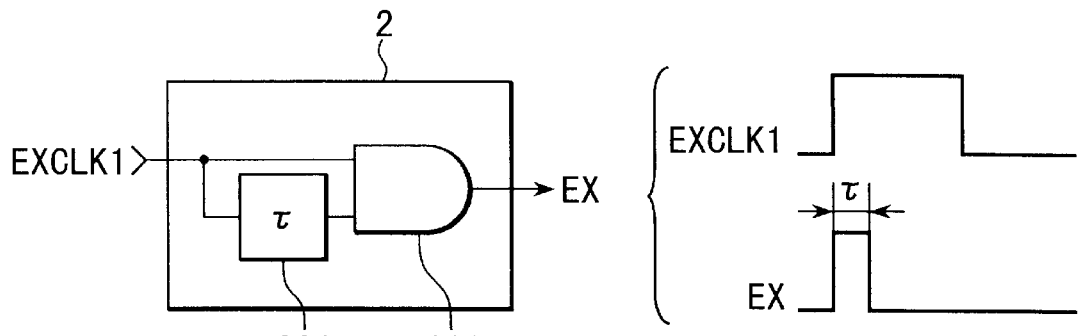
FIG. 5A is a circuit diagram of the pulse generating circuit incorporated in the semiconductor integrated circuit shown in FIG. 3.
FIG. 5B is a timing chart showing the waveforms of the input and output signals of the pulse generating circuit shown in FIG. 5A.

First, the pulse generating circuit 2 will be described with reference to FIGS. 5A and 5B. FIG. 5A is a circuit diagram of the circuit 2. FIG. 5B is a timing chart showing the waveforms of the input and output signals of the circuit shown 6.

As shown in FIG. 5A, the circuit 2 comprises a delay element 201 and an EXOR gate 202. The delay element 201 has a delay time τ and generates a signal opposite in phase to the input signal EXCLK1. As seen from FIG. 5B, the circuit 2 generates a pulse at the rising edge if the input signal EXCLK1. The output signal of the circuit 2 has a duration equal to the delay time τ of the delay element 201.

Figures 5C, 5D:
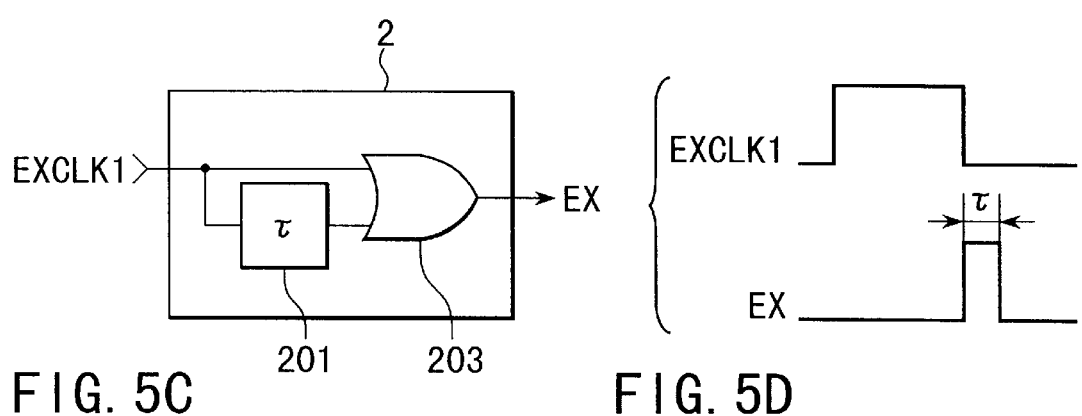
FIG. 5C is a circuit diagram of a modification of the pulse generating circuit shown in FIG. 5A.
FIG. 5D is a timing chart showing the waveforms of the input and output signals of the circuit shown in FIG. 5C.

FIG. 5C illustrates a modification of the pulse generating circuit 2 shown in FIG. 5A. FIG. 5D is a timing chart showing the waveforms of the input and output signals of the modified pulse generating circuit shown in FIG. 5C. As seen from FIG. 5C, the modified pulse generating circuit differs from the circuit of FIG. 5A, only in an OR gate 203 is used in place of the EXOR gate 202 (FIG. 5A). As shown in FIG. 5D, the circuit of FIG. 5C generates a pulse having a duration equal to the delay time τ of the delay element 201, at the falling edge of the input signal EXCLK1.

Figure 6:
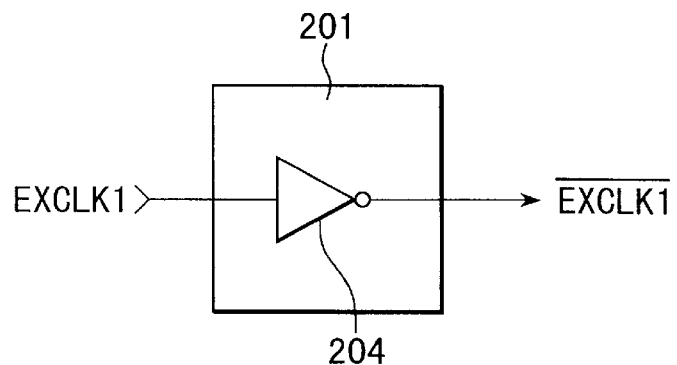
FIG. 6 is a circuit diagram of a delay element provided for use in the pulse generating circuits shown in FIGS. 5A and 5C.

FIG. 6 is a circuit diagram of the delay element 202 incorporated in the pulse generating circuit 2 and the modification thereof. As shown in FIG. 6, the delay element 201 comprises an inverter 204. The inverter 204 inverts the input signal EXCLK1, generating a signal /EXCLK1.

Four types of delay elements that may be used as the delay elements 4 of the cycle measuring circuit 3 and as the delay elements 40 of the time converting circuit 76 will be described, with reference to FIGS. 7A to 7C.

Figure 7A:
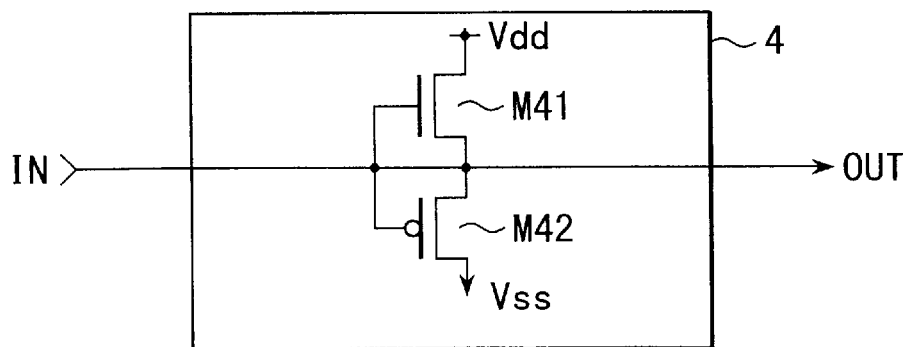
FIG. 7A is a circuit diagram of a delay element of the first type for use in semiconductor integrated circuit shown in FIG. 3.

FIG. 7A shows a delay element 4 of the first type. As shown in FIG. 7A, the delay element 4 comprises an input terminal IN, an output terminal OUT, an n-channel MOSFET M41 and a p-channel MOSFET M42. The n-channel MOSFET M41 has its drain connected to receive the power-supply voltage Vdd, its gate connected to the input terminal IN and its source connected to the output terminal OUT. The p-channel MOSFET M42 has its drain connected to receive the ground voltage Vss, its gate connected tot he input terminal IN and its source connected to the output terminal OUT. The delay element 4 differs from the ordinary CMOS inverter in the positions of the n-channel and p-channel MOSFETs. The element 4 can generates a signal which is in phase with the input signal, though it comprises less components than the ordinary CMOS inverter.

Figure 7B:
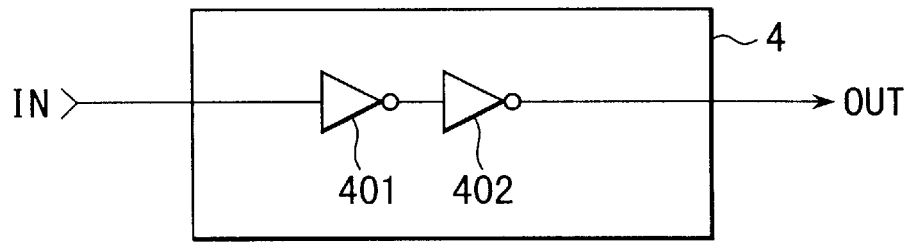
FIG. 7B is a circuit diagram of a delay element of the second type for use in semiconductor integrated circuit shown in FIG. 3.

FIG. 7B illustrates a delay element 4 of the second type. This delay element 4 comprises two inverters 401 and 402, an input terminal IN and an output terminal OUT. The inverters 401 and 402 are connected in series between the input terminal IN and the output terminal OUT.

Figure 7C:
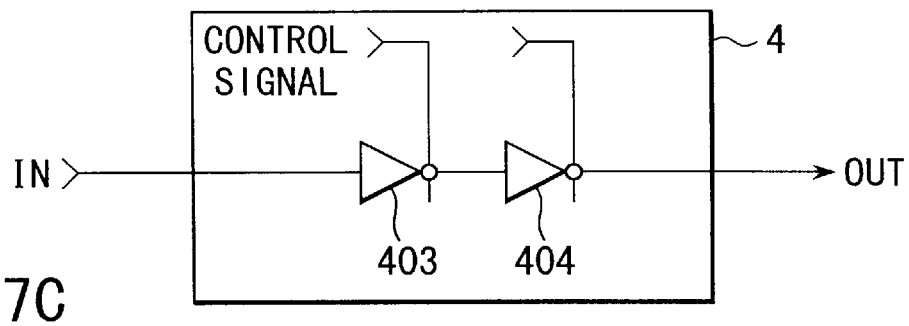
FIG. 7C is a circuit diagram of a delay element of the third type for use in semiconductor integrated circuit shown in FIG. 3.

FIG. 7C depicts a delay element 4 of the third type, which is designed to enable or disable the transfer of pulses through a delay line in accordance with a control signal. As shown in FIG. 7C, the delay element 4 comprises an input terminal IN, an output terminal OUT, and two clocked inverters 403 and 404. The clocked inverters 403 and 404 are connected in series between the input terminal IN and the output terminal OUT. The inverters 403 and 404 have a control terminal each. A control signal is supplied to the control terminal of each inverter, enabling or disabling the inverter to transfer pulses. The clocked inverter 404 connected to the output terminal OUT is provided to output a signal which is in phase with the signal supplied to the input terminal IN. Therefore, the control signal may be supplied to the control terminal of the clocked inverter 404 only, and the control input terminal of the clocked inverter 403 may be connected to a positive power supply. If this is the case, the clocked inverter 403 is always enabled to transfer pulses.

Figure 7D:
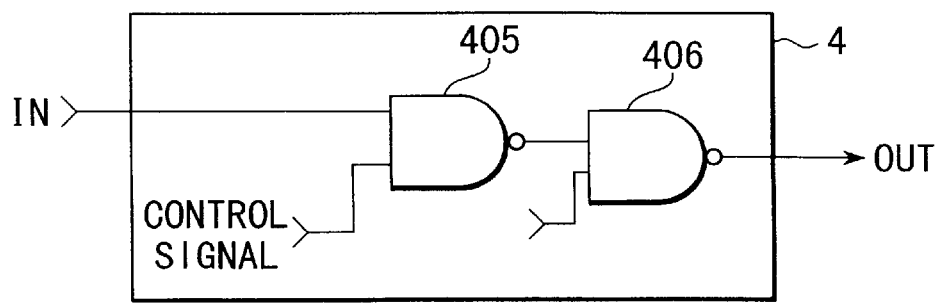
FIG. 7D is a circuit diagram of a delay element of the fourth type for use in semiconductor integrated circuit shown in FIG. 3.

FIG. 7D illustrates a delay element 4 of the fourth type. This delay element 4 is designed to enable or disable the transfer of pulses through a delay line in accordance with a control signal. As shown in FIG. 7D, the delay element 4 comprises an input terminal IN, an output terminal OUT, and two 2-input NAND gates 405 and 406. The NAND gate 405 has its first input terminal connected to the input terminal IN and its second input terminal connected to receive a control signal. When the control signal is "1," the NAND gate 405 functions as an inverter. The first input terminal of the NAND gate 406 is connected to the output of the NAND gate 405. The second input terminal of the NAND gate 406 is connected to receive a control signal. Alternatively, the second input terminal of the NAND gate 406 may be connected to a positive power supply.

The 2-input NAND gate 406 is provided to generate a signal in phase with the signal supplied to the input terminal IN and to supply the signal to the output terminal OUT. In principle, the NAND gate 406 can be composed of an ordinary CMOS inverter to perform these functions. If composed of a CMOS inverter, however, a pulse signal has its duration changed every time it passes through a delay line, for the following reason, and may not propagate at all in some cases. A CMOS inverter and a NAND gate may have a current-drive ability when they output "1" and a different current-drive ability when they output "0" due to process variation. Hence, a CMOS inverter used in place of the NAND gate 406 may have an input-output characteristic different from the input-output characteristic the NAND gate 405 has while functioning as an inverter. Consequently, the duration of the pulse increases or decreases every time the pulse passes a delay line for the following reason.

In the delay element 4 of FIG. 7D, two NAND gates 405 and 406 connected in series exhibit the same input-output characteristic when they are function as inverters. The delay in the rising edge of the pulse is therefore compensated by the delay in the falling edge of the pulse. As a result, the pulse does not have its duration changed while passing through the delay line, as in the delay element of FIG. 7B which comprises two CMOS inverters connected in series.

The 2-input NAND gate 406 can function as an inverter, also in the case where both the first input terminal and the second input terminal are connected to the output terminal of the 2-input NAND gate 405 provided at the input side.

As described above, the delay elements 40 of the time converting circuit 7, as well as the delay elements 4 of the cycle measuring circuit 3, can be of any of the four types shown in FIGS. 7A to 7D. Moreover, the transistors incorporated in each delay element 40 have the same size (e.g., the gate width of FETs) as the transistors provided in each delay element 4 of the cycle measuring circuit 3. The time each pulse requires to pass through one delay element 40 in the time converting circuit 7 is therefore equalized to the time each pulse requires to pass through on delay element 4 in the cycle measuring circuit 3. This enables the time converting circuit 7 to generate a pulse signal RSLT which has exactly half the cycle measured by the cycle measuring circuit 3.

Figure 8A:
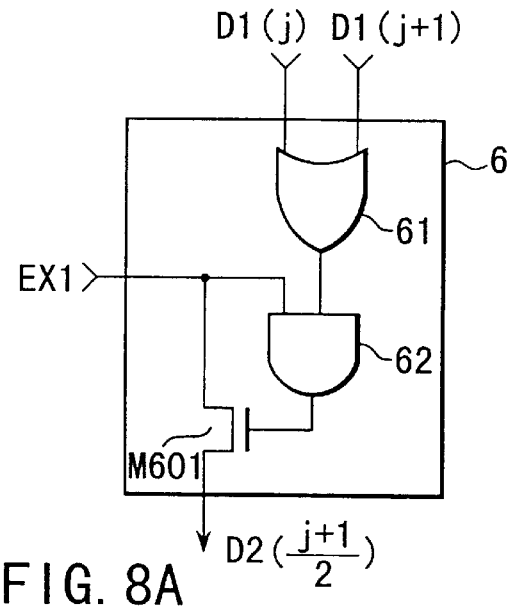
FIG. 8A is a circuit diagram showing one of the identical pulse output circuits incorporated in the semiconductor integrated circuit shown in FIG. 3.

The pulse output circuits 6 provided in the number converting circuit 5 are identical in structure. FIG. 8A shows one of the pulse output circuits 6.

As shown in FIG. 8A, the pulse output circuit 6 comprises a 2-input OR gate 61, a 2-input EXOR gate 62, and an n-channel MOSFET M601. The OR gate 61 receives two pulses D1(j) and D1(j+1) (j=1, 3, 5, . . . N) from the cycle measuring circuit 3. The EXOR gate 62 receives the output signal of the OR gate 61 and the pulse signal EX1 output from the pulse-duration modulating circuit 21. The n-channel MOSFET M601 has a drain connected to receive the pulse signal EX1, a gate connected to the output terminal of the EXOR gate 62, and a source connected to an output terminal. The output terminal is provided to output a pulse D2((j+1)/2) from the pulse output circuit 6.

The operation of the pulse output circuits 6 will be described with reference to FIG. 4. In the pulse output circuit 6 which has received two pulses D1(1) and D1(2), both input pulses D1(1) and D1(2) are at logic level "0." while the pulse signal EX1 remains at logic level "1." Therefore, the output of the OR gate 61 is at logic level "0," and the output of the EXOR gate 62 is therefore at logic level "0" regardless of the logic level of the pulse signal EX1. As a result, the MOSFET n-channel MOSFET M601 is turned off, not outputting a pulse D2(1). Then, in the pulse output circuit 6 which has received two pulses D1(5) and D1(6), the input pulses D1(5) and D1(6) are at logic level "0" and logic level "1," respectively, while the pulse signal EX1 remains at logic level "1." Therefore, the output of the OR gate 61 is at logic level 111,11 and the output of the EXOR gate 62 is therefore at logic level "1" when the pulse signal EX1 is at logic level "1." As a result, the n-channel MOSFET M601 is turned on, outputting the pulse signal EX1 as a pulse D2(3). In this way, each pulse output circuit 6 outputs the pulse signal EX1 when the pulse signal EX is supplied to either the input D1(j) or the input D1(j+1), and outputs nothing at all when the pulse signal EX is supplied to neither the input D1(j) nor the input D1(j+1).

Figure 8B:
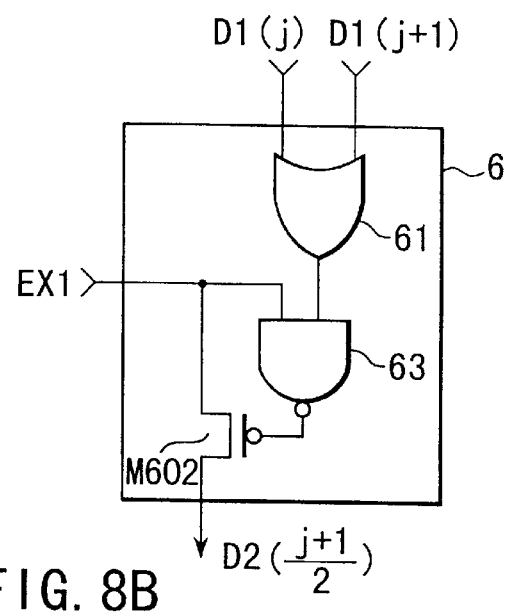
FIGS. 8B, 8C and 8D illustrate three modifications of the pulse output circuit shown in FIG. 8A.
Figure 8C:
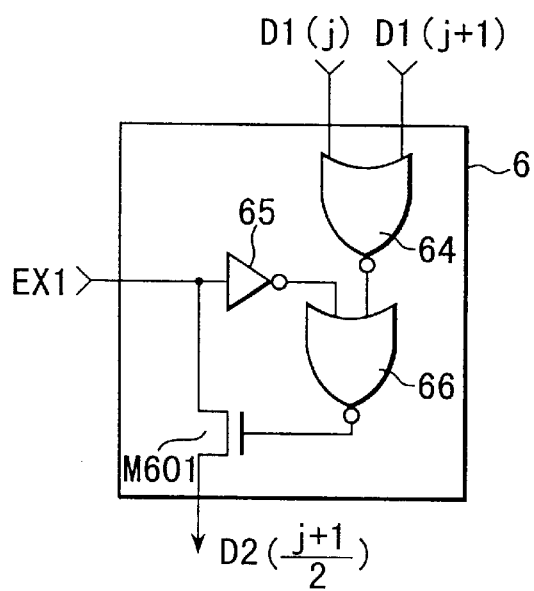

The pulse output circuits 6 may be replaced by those of any one of the three alternative types that are illustrated in FIGS. 8A, 8B and 8C. The three alternative types of circuits 6 will be described below.

The first alternative type shown in FIG. 8B differs from the circuit 6 shown in FIG. 8A in that a NAND gate 63 and a p-channel MOSFET M602 are used in place of the EXOR gate 62 and the n-channel MOEFET M601, respectively. The NAND gate 63 receives the output signal of the OR gate 61 and the pulse signal EX1 output from the pulse-duration modulating circuit 21. The p-channel MOSFET M602 has a source connected to receive the pulse signal EX1, a gate connected to the output terminal of the NAND gate 63, and a drain connected to an output terminal. The output terminal is provided to output a pulse D2((j+1)/2) from the pulse output circuit 6. The first alternative type shown in FIG. 8B operates exactly in the same way as the pulse output circuit 6 shown in FIG. 8A.

The second alternative type shown in FIG. 8C differs from the circuit 6 shown in FIG. 8A in that a NAND gate 64 and a NAND gate 66 are used in place of the OR gate 61 and the EXOR gate 62, respectively, and that an inverter 65 is provided. The NAND gate 64 receive two output pulses D1(j) and D1(j+1) from the cycle measuring circuit 3. The inverter 65 receives the pulse signal EX1. The NAND gate 66 receives the output of the NAND gate 64 and the output of the inverter 65. The second alternative type shown in FIG. 8C also operates exactly in the same way as the pulse output circuit 6 shown in FIG. 8A.

Figure 8D:
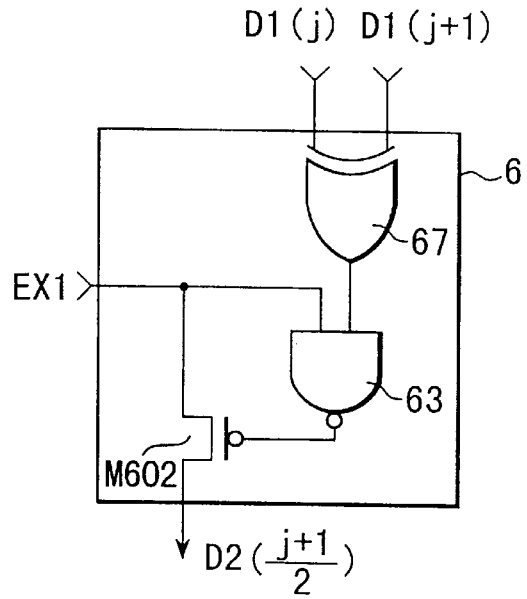

The third alternative type shown in FIG. 8D is different from the circuit 6 shown in FIG. 8A in that an exclusive OR (EXOR) gate 67, NAND gate 63 and p-channel MOSFET M602 are used in place of the OR gate 61, EXOR gate 62 and n-channel MOSFET M601, respectively. The exclusive OR gate 67 receives two output pulses D1(j) and D1(j+1) from the cycle measuring circuit 3. The third alternative type shown in FIG. 8D also operates exactly in the same way as the pulse output circuit 6 shown in FIG. 8A.

The logic circuit 8 will be described in detail, with reference to FIG. 9.

Figure 9:
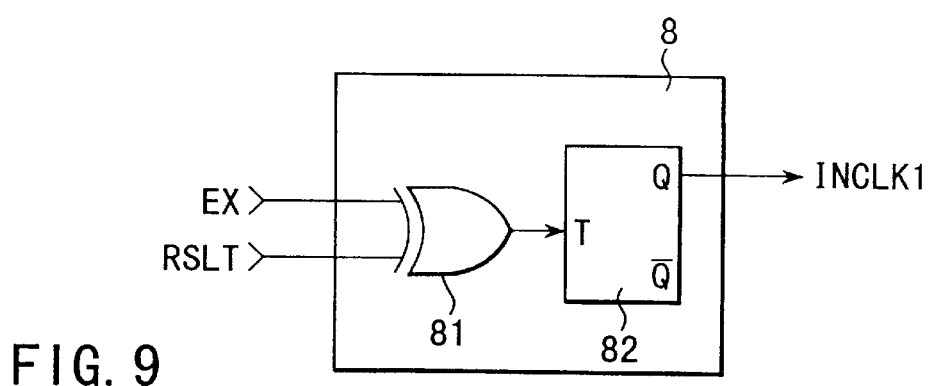
FIG. 9 is a circuit diagram of the logic circuit incorporated in the semiconductor integrated circuit shown in FIG. 3.

As FIG. 9 shows, the logic circuit 8 comprises a 2-input EXOR gate 81 and a T-type flip-flop 82. The EXOR gate 81 receives the pulse signal EX and the pulse signal RSLT at its two input terminals. The flip-flop 82 outputs an internal clock signal INCLK1 whose state changes every time the output of the EXOR gate 81 is set at logic level "1." As seen from FIG. 4, the internal clock signal INCLK1 has its logic level changed from "1" to "0," or vice versa, every time the pulse signal EX or the pulse signal RSLT is input to the logic circuit 8.

(Second Embodiment)

An internal clock generating circuit according to the second embodiment of the invention will now be described.

Figure 10:
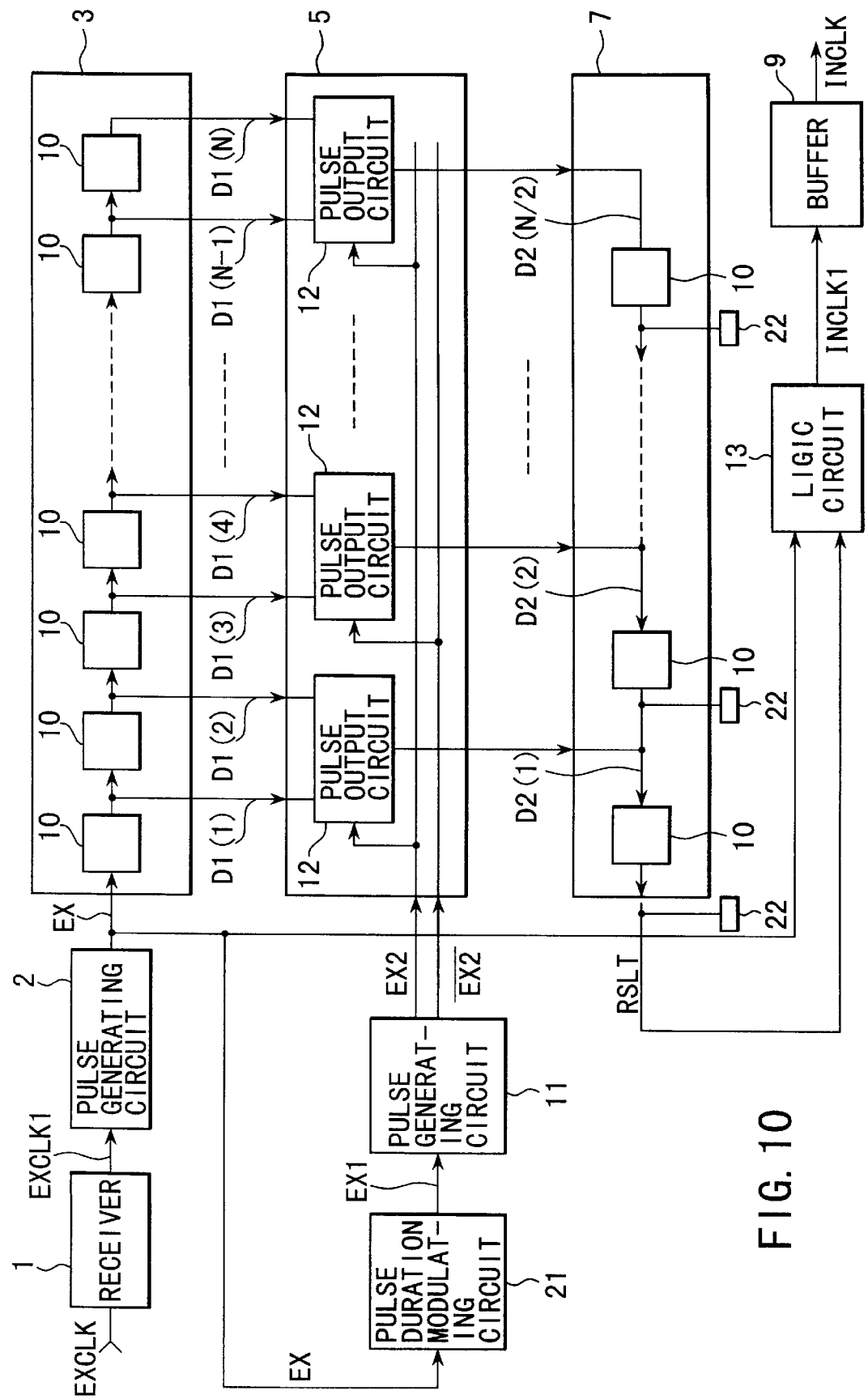
FIG. 10 is a block diagram showing a semiconductor integrated circuit according to a second embodiment of the invention.

The first embodiment incorporates the delay elements 4 and 40 designed to generate a pulse that is in phase with the input pulse. The second embodiment has delay elements 10 designed to generate a pulse that is opposite in phase to the input pulse. FIG. 10 is a block diagram showing the second embodiment, which generate an internal clock signal having a duty ratio of 50%. The second embodiment differs from the first embodiment of FIG. 3 in four respects. First, each delay element 10 generates a pulse that is opposite in phase to the input pulse. Second, a pulse generating circuit 11 is provided to generate a pulse signal EX2 and a pulse signal /EX2 opposite in phase to the signal EX2, from the pulse signal EX1. Third, the pulse signals EX2 and /EX2 control each of the pulse output circuits 12 constituting the number converting circuit 5. Fourth, a logic circuit 13 used in place of the logic circuit 8 is different in structure from the logic circuit 8.

How the second embodiment generates an internal clock signal having a duty ratio of 50% from an external clock signal EXCLK having a cycle T and a duty ratio of 33% will be explained, with reference to the timing chart of FIG. 11. In order to illustrate the operation of the internal clock generating circuit according to the second embodiment, the delay times other than those of the delay elements 10 and 40 are neglected and not shown in the timing chart.

It is assumed that the pulse signal EX1 has its rising edge completely synchronous with the rising edge of the external clock signal EXCLK. Further, it is assumed that the pulse signals EX2 and /EX2 which control the number converting circuit 5 are completely in phase with the pulse signal EX.

Since the delay time of the receiver 1 is neglected, the clock signal EXCLK1 output from the receiver 1 is completely in phase with the external clock signal EXCLK. The pulse generating circuit 2 generates a pulse signal EX at the rising edge of the clock signal EXCLK1. The pulse signal EX is input to the cycle measuring circuit 3. In the circuit 3, the pulse signal EX passes through the delay line. The delay elements 10 provided in the circuit 3 outputs a pulse that is opposite in phase to the input pulse. The delay elements 10 have a delay time $t_{unit}$. In the instance of FIG. 11, $t_{unit}$=T/6. The outputs D1(1) to D1(7) of the delay elements 10 are delayed by $t_{unit}$, $2 \times t_{unit}$, $3 \times t_{unit}$, $4 \times t_{unit}$, $5 \times t_{unit}$, $6 \times t_{unit}$, and $7 \times t_{unit}$, respectively, with respect to the pulse signal EX.

Figure 11:
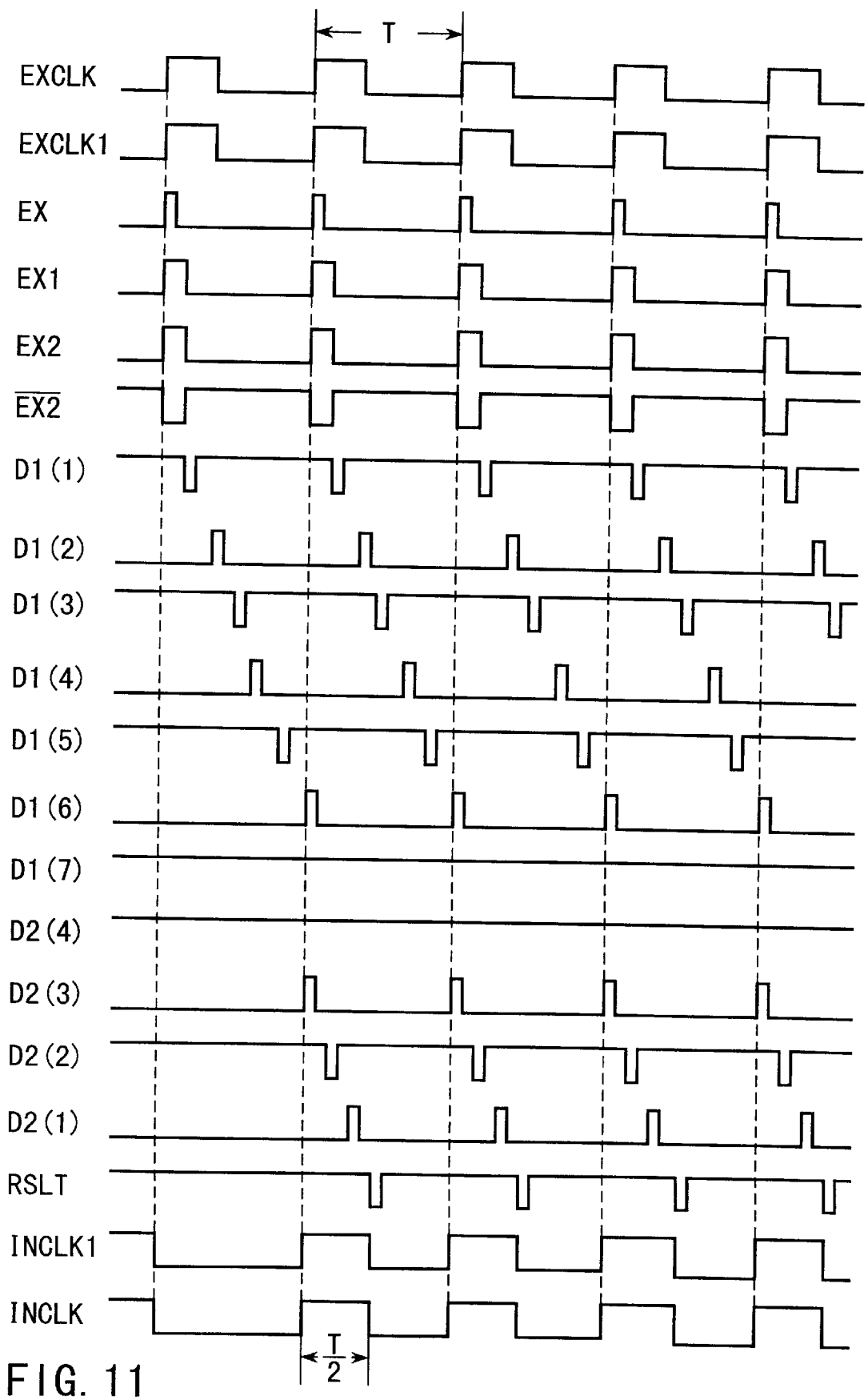
FIG. 11 is a timing chart explaining the operation of the circuit shown in FIG. 10.

The cycle measuring circuit 3 measures a cycle represented by a natural number m (=j+1) which takes a minimum value when the two outputs D1(j) and D1(j+1) which the circuit 3 generates in response to the pulse signal EX are both at logic level "1" or at logic level "0." In other words, the number m represents the cycle when the output D1 of the circuit 3 and the pulse signal EX2 are at logic level "1" or when the output D1 and the pulse signal /EX2 are at logic level "0." In the instance of FIG. 11, m=6.

The number converting circuit 5 converts the number m to m/2. The circuit 5 outputs either the pulse signal EX2 or /EX2 as an output pulse D2(m/2). As mentioned above, the pulse signals EX2 and /EX2 have been generated by the pulse generating circuit 11. The pulse D2(m/2) is input to the time converting circuit 7. More precisely, it is supplied to the (m/2)th delay element 40 provided in the time converting circuit 7 and passes through the delay line. Since m=6, the pulse D2(4) does not change at all, and the pulses D2(3) rises at the same time as the pulse D1(6). The output pulsed D2(1) and D2(2) of each delay element 40 and the pulse signal RSLT output from the time converting circuit 7 are delayed by $t_{unit}$, while being inverted with respect to the pulse signal EX.

The logic circuit 13 generates an internal clock signal INCLK1 which changes when the pulse signal EX takes logic level "1" or when the pulse signal RSLT takes logic level "0." Since the signal RSLT is delayed by half the cycle with respect to the pulse signal EX, the internal clock signal INCLK1 has a duty ratio of 50%. Hence, the second embodiment can generate an internal clock signal INCLK having a duty ratio of 50%, if the delay time of the buffer 9 is neglected.

The pulse signal EX is generated at the rising edge of the internal clock signal INCLK1. Instead, the signal EX may be generated at the falling edge of the internal clock signal INCLK1. In whichever case, the second embodiment works well.

Figure 12:
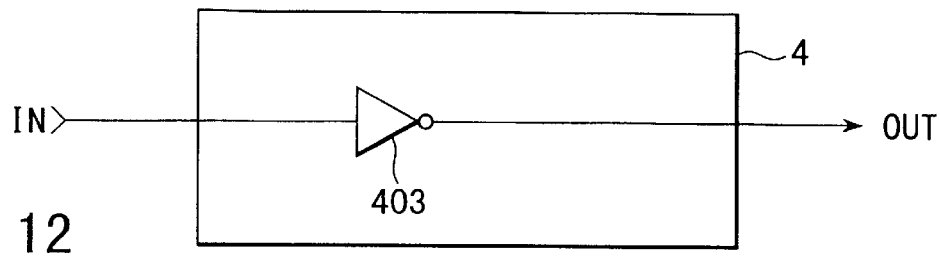
FIG. 12 is a circuit diagram showing one of the delay elements which are incorporated in the semiconductor integrated circuit shown in FIG. 10 and which are identical in structure.

The delay elements 10 and 40 will be described, with reference to FIG. 12. As shown in FIG. 12, each of the delay elements 10 and 40 comprises an inverter 403. The inverter 403 inverts an input pulse IN and generates an output pulse OUT. The output pulse OUT is opposite in phase to the input pulse IN.

The pulse output circuits 12 constituting the number converting circuit 5 will be described in detail, with respect to FIG. 13A.

Figures 13A, 13B:
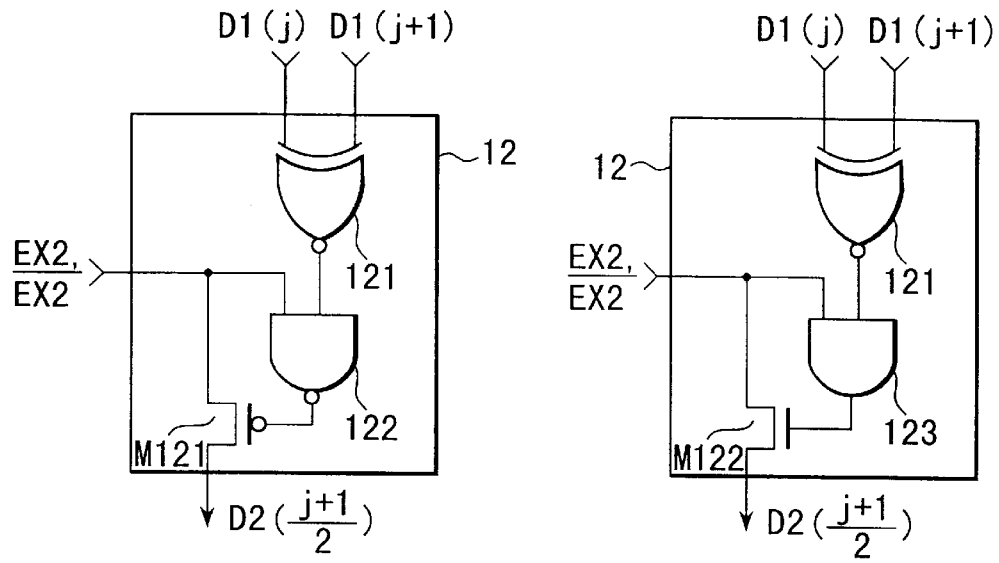
FIG. 13A is a circuit diagram showing one of the pulse output circuits which are provided in the semiconductor integrated circuit shown in FIG. 10 and which are identical in structure.
FIGS. 13B to 13D illustrate three modifications of the pulse output circuit illustrated in FIG. 13A.

As FIG. 13A shows, each pulse output circuit 12 comprises an exclusive NOR gate 121, a NAND gate 122, and a p-channel MOSFET M121. The exclusive NOR gate 121 receives two pulses D1(j) and D1(j+1) supplied from the cycle measuring circuit 3. The NAND gate 122 receives the output signal of the exclusive NOR gate 121 and the pulse signal EX2 or /EX2. The p-channel MOSFET M121 has a source connected to receive the pulse signal EX2 or /EX2, a gate connected to the output of the NAND gate 122, and a drain for outputting a pulse D2((j+1)/2).

The operation of the pulse output circuit 12 will be explained, with reference to the timing chart of FIG. 11.

In the pulse output circuit 12 which has received two pulses D1(1) and D1(2), both input pulses D1(1) and D1(2) are at logic level "0" while the pulse signal EX1 remains at logic level "1." Therefore, the output of the exclusive NOR gate 121 is at logic level "0," and the output of the NAND gate 122 is therefore at logic level "1" regardless of the logic level of the pulse signal EX2. As a result, the MOSFET p-channel MOSFET M121 is turned off, not outputting a pulse D2(1). Then, the pulse signal EX2 controls the pulse output circuit 12 which has received two pulses D1(5) and D1(6). The pulses D1(5) and D1(6) are at logic level "1" when the pulse signal EX2 rises. Hence, the exclusive NOR gate 121 generates an output at logic level "0." The MOSFET M121 is therefore turned on, outputting the signal EX2 as a pulse D2(3).

In this way, each pulse output circuit 12 outputs the pulse signal EX2 or /EX2 when the pulse signal EX is supplied to either the input D1(j) or the input D1(j+1), and outputs nothing at all when the pulse signal EX2 or /EX2 is supplied to neither the input D1(j) nor the input D1(j+1), while either the pulse signal EX2 or /EX2 remains at logic level "1" or "0", respectively.

Figures 13C, 13D:
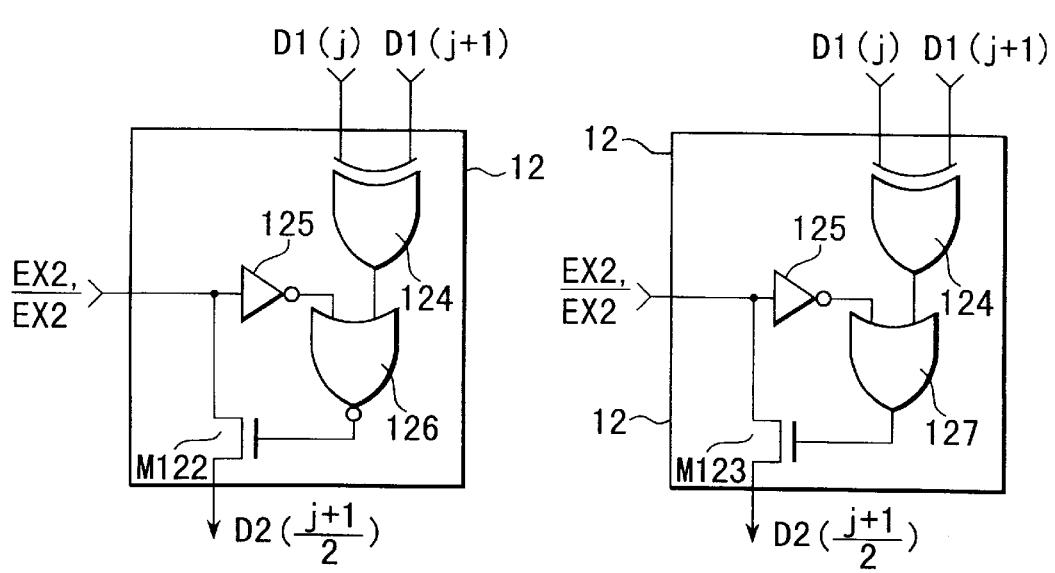

Each pulse output circuits 12 may be replaced by any one of the three modifications that are illustrated in FIGS. 13A, 13B and 13C. The three alternative modification will be described below.

As shown in FIG. 13B, the first modified pulse output circuit comprises an exclusive NOR gate 121, an EXOR gate 123, and an n-channel MOSFET M122. The exclusive NOR gate 121 receives two pulses D1(j) and D1(j+1) supplied from the cycle measuring circuit 3. The EXOR gate 123 receives the output signal of the exclusive NOR gate 121 and the pulse signal EX2 or /EX2. The n-channel MOSFET M122 has a drain connected to receive the pulse signal EX2 or /EX2, a gate connected to the output of the EXOR gate 123, and a source for outputting a pulse D2((j+1)/2). The first modified pulse output circuit operates, exactly in the same way as the pulse output circuit 12 shown in FIG. 13A.

As shown in FIG. 13C, the second modified pulse output circuit comprises an exclusive OR gate 124, an inverter 125, a NOR gate 126, and an n-channel MOSFET M122. The exclusive OR gate 124 receives two pulses D1(j) and D1(j+1) supplied from the cycle measuring circuit 3. The inverter 125 receives either the pulse signal EX2 or the pulse signal /EX2. The NOR gate 126 receives the output signal of the exclusive OR gate 124 and the output signal of the inverter 125. The n-channel MOSFET M122 has a drain connected to receive the pulse signal EX2 or /EX2, a gate connected to the output of the NOR gate 126, and a source for outputting a pulse D2((j+1)/2). The second modified output circuit operates, exactly in the same way as the pulse output circuit 12 shown in FIG. 13A.

As shown in FIG. 13D, the third modified pulse output circuit comprises an exclusive OR gate 124, an inverter 125, an OR gate 127, and a p-channel MOSFET M123. The exclusive OR gate 124 receives two pulses D1(j) and D1(j+1) supplied from the cycle measuring circuit 3. The inverter 125 receives either the pulse signal EX2 or the pulse signal /EX2. The OR gate 127 receives the output signal of the exclusive OR gate 124 and the output signal of the inverter 125. The n-channel MOSFET M123 has a source connected to receive the pulse signal EX2 or /EX2, a gate connected to the output of the OR gate 127, and a drain for outputting a pulse D2((j+1)/2). The third modified pulse output circuit operates, exactly in the same way as the pulse output circuit 12 shown in FIG. 13A.

The logic circuit 13 will be described, with reference to FIGS. 14A and 14B.

Figure 14A:
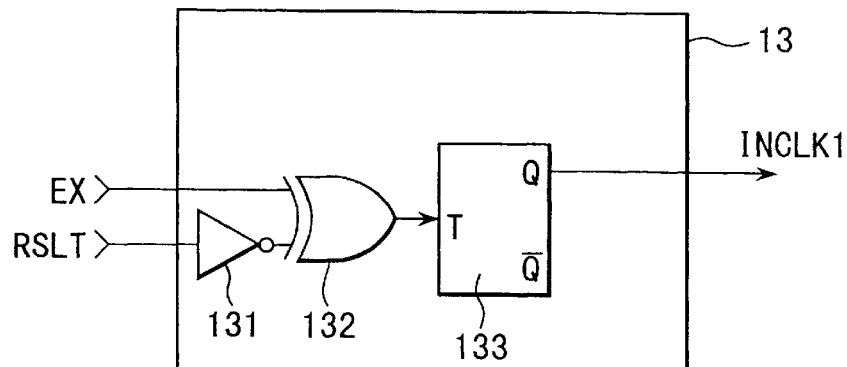
FIGS. 14A and 14B are diagrams showing two alternative logic circuits for use in the semiconductor integrated circuit shown in FIG. 10.

FIG. 14A shows the first type of the logic circuit 13. As shown in FIG. 14A, the first type comprises an inverter 131, an EXOR gate 132, and a T-type flip-flop 133. The inverter 131 receives the pulse signal RSLT. The EXOR gate 132 receives the pulse signal EX and the output signal of the inverter 131. The T-type flip-flop 133 generates an internal clock signal INCLK1 every time the output signal of the EXOR gate 132 takes logic level "1." As seen from FIG. 11, the internal clock signal INCLK1 has its logic level changed from "1" to "0," or vice versa, every time the pulse signal EX or the pulse signal RSLT is input to the logic circuit.

Figure 14B:
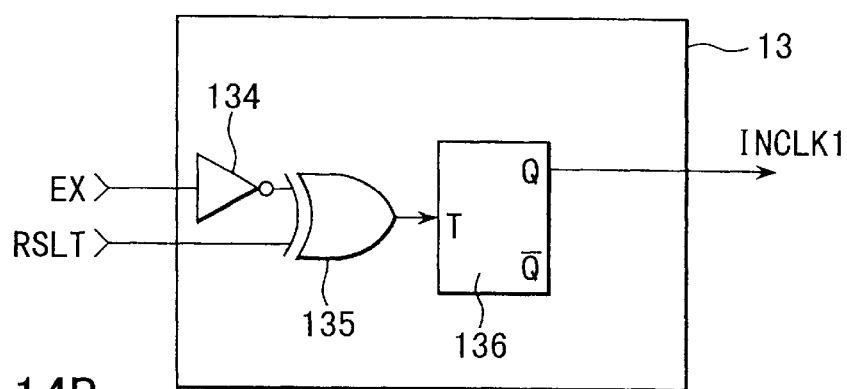

FIG. 14B shows the second type of the logic circuit 13. As shown in FIG. 14B, the second type comprises an inverter 134, an EXOR gate 135, and a T-type flip-flop 136. The inverter 134 receives the pulse signal EX. The EXOR gate 135 receives the pulse signal RSLT and the output signal of the inverter 134. The T-type flip-flop 136 generates an internal clock signal INCLK1 every time the output signal of the EXOR gate 135 takes logic level "1." As seen from FIG. 11, the internal clock signal INCLK1 has its logic level changed from "1" to "0," or vice versa, every time the pulse signal EX or the pulse signal RSLT is input to the logic circuit.

Figures 15, 18:
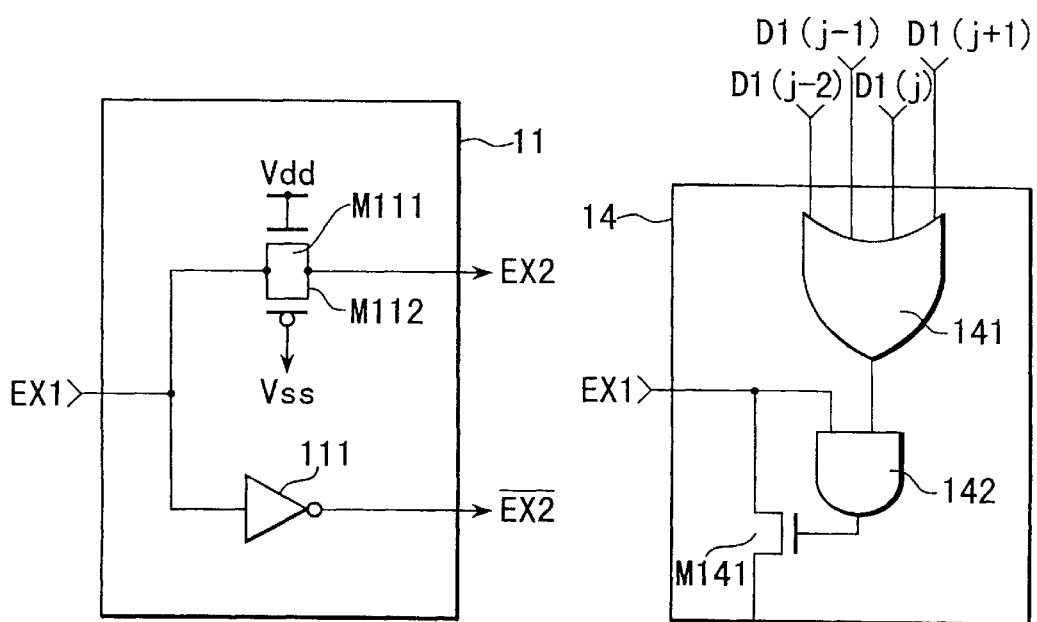
FIG. 15 is a circuit diagram showing one of the pulse generating circuits incorporated in the circuit shown in FIG. 10.
FIG. 18 is a diagram illustrating one of the identical pulse output circuits incorporated in the circuit of FIG. 16.

The pulse generating circuit 11 will be described in detail, with reference to FIG. 15. As FIG. 15 shows, the circuit 11 comprises an n-channel MOSFET M111, a p-channel MOSFET M112, and an inverter 111. The MOSFET M111 has a drain connected to receive the pulse signal EX1, a gate connected to receive the power-supply voltage Vdd and a source for outputting a pulse signal EX2. The MOSFET M112 has a drain connected to receive the pulse signal EX1, a gate connected to receive the ground voltage Vss and a source for outputting the pulse signal EX2. The inverter 111 receives the pulse signal EX1 and outputs a pulse signal /EX1. The MOSFETs M111 and M112 have their gate widths adjusted such that their delay times are equal to the delay time of the inverter 111.

As described above, both the first embodiment and the second embodiment are designed to generate an internal clock signal having a duty ratio of 50%. Nonetheless, either embodiment can be modified to generate an internal clock signal having a duty ratio of $1/2^K \times 100\%$ (K is a natural number). For example, either embodiment can generate a clock signal having a duty ratio of 25% if a pulse delayed by T/2 with respect to the external clock signal is used as the pulse signal EX1 in the circuit shown in FIG. 3 or 10. Further, either embodiment can generate a clock signal having a duty ratio of 12.5% if a pulse delayed by T/4 with respect to the external clock signal is used as the pulse signal EX1. Namely, the first and second embodiments can generate a clock signal having a duty ratio of $1/2^K \times 100\%$ if a pulse delayed by the cycle T times $1/2^{K+1}$ with respect to the external clock signal is used as the pulse signal EX1. Moreover, either embodiments can generate a clock signal having a duty ratio of 25% if the number converting circuit 5 converts a parameter m to a parameter m/4, and can generate a clock signal having a duty ratio of 12.5% if the number converting circuit 5 converts a parameter m to a parameter m/8.

(Third Embodiment)

An internal clock generating circuit according to the third embodiment of the invention will now be described. The third embodiment is designed to generate an internal clock signal having a duty ratio of 25%.

Figure 16:
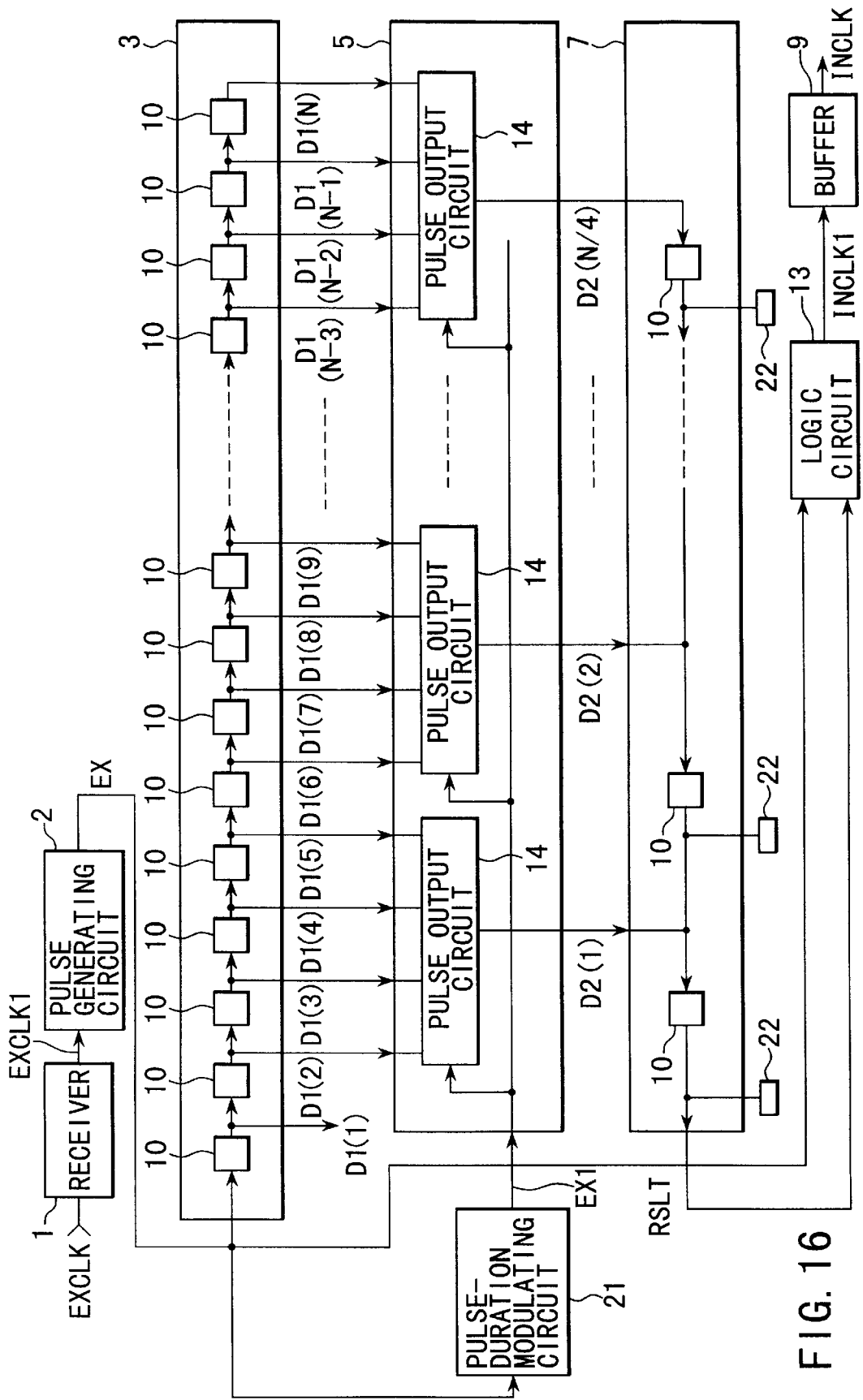
FIG. 16 is a block diagram showing a semiconductor integrated circuit according to a third embodiment of the invention.

FIG. 16 is a block diagram showing the structure of the third embodiment. The third embodiment differs from the first embodiment (FIG. 3) in that each pulse output circuit 14 incorporated in the number converting circuit 5 receives the four pulses D1(j−2), D1(j−1), D1(j) and D1(j+1) from four adjacent delay elements 10.

With reference to the timing chart of FIG. 17, it will be described how the third embodiment generates an internal clock signal having a duty ratio of 25% from an external clock signal EXCLK having a duty ratio of 37.5%. In order to illustrate the operation of the circuit, the delay times other than those of the delay elements 10 provided in the cycle measuring circuit 3 and time converting circuit 7 are neglected and not shown in FIG. 17. For the same purpose, it is assumed that the pulse signal EX1 is completely in phase with the rising edge of the external clock signal EXCLK and that the number converting circuit 5 is controlled by the pulse signal EX.

Since the delay time of the receiver 1 is neglected, the external clock signal EXCLK1 output from the receiver 1 is in phase with the external clock signal EXCLK supplied to the receiver 1. The pulse generating circuit 2 outputs a pulse signal EX at the rising edge of the clock signal EXCLK1. The pulse signal EX is supplied to the measuring circuit 3 and passes through the delay line of the circuit 3. Assume that each delay element 10 provided in the circuit 3 has a delay time $t_{unit}$ and generates a pulse that is in phase with the input pulse. As shown in FIG. 17, the time $t_{unit}$ is T/8B. The outputs D1(1) to D1(9) of the delay elements 10 are delayed by $t_{unit}$, $2 \times t_{unit}$, $3 \times t_{unit}$, $4 \times t_{unit}$, $5 \times t_{unit}$, $6 \times t_{unit}$, $7 \times t_{unit}$, $8 \times t_{unit}$ and $9 \times t_{unit}$, respectively, with respect to the pulse signal EX. The least natural number i satisfying the condition that any one of the four outputs D1(i−2), D1(i−1), D1(i) and D1(i+1) which the cycle measuring circuit 3 generates in response to the pulse signal EX represents the cycle the circuit 3 should measure. In the instance of FIG. 17, i=8.

The number converting circuit 5 converts the number i to i/4 and generates a pulse signal EX1 (=EX). The pulse signal EX1 is supplied via the D2(i/4)th output terminal to the i/4th delay element 10 of the time converting circuit 7. The pulse signal EX1 passes through the delay line of the circuit 7. Since i=8, the pulse D2(3) remains unchanged, and the pulse D2(2) rises at the same time as the output pulse D1(8) of the cycle measuring circuit 3. Hence, the output pulse D2(1) of the first pulse output circuit 14 of the number converting circuit 5 and the output pulse signal RSLT of the time converting circuit 7 are delayed by $t_{unit}$ with respect to the pulse signal EX.

The logic circuit 13 generates an internal clock signal INCLK1 when either the pulse signal EX or the pulse signal RSLT output from the time converting circuit 7 takes logic level "1." Since the pulse signal RSLT is delayed the cycle 1/4 with respect to the pulse signal EX, the internal clock signal INCLK1 has a duty ratio of 25%. An internal clock signal INCLK having a duty ratio of 25% can therefore be generated if the delay time of the buffer 9 is neglected.

Figure 17:
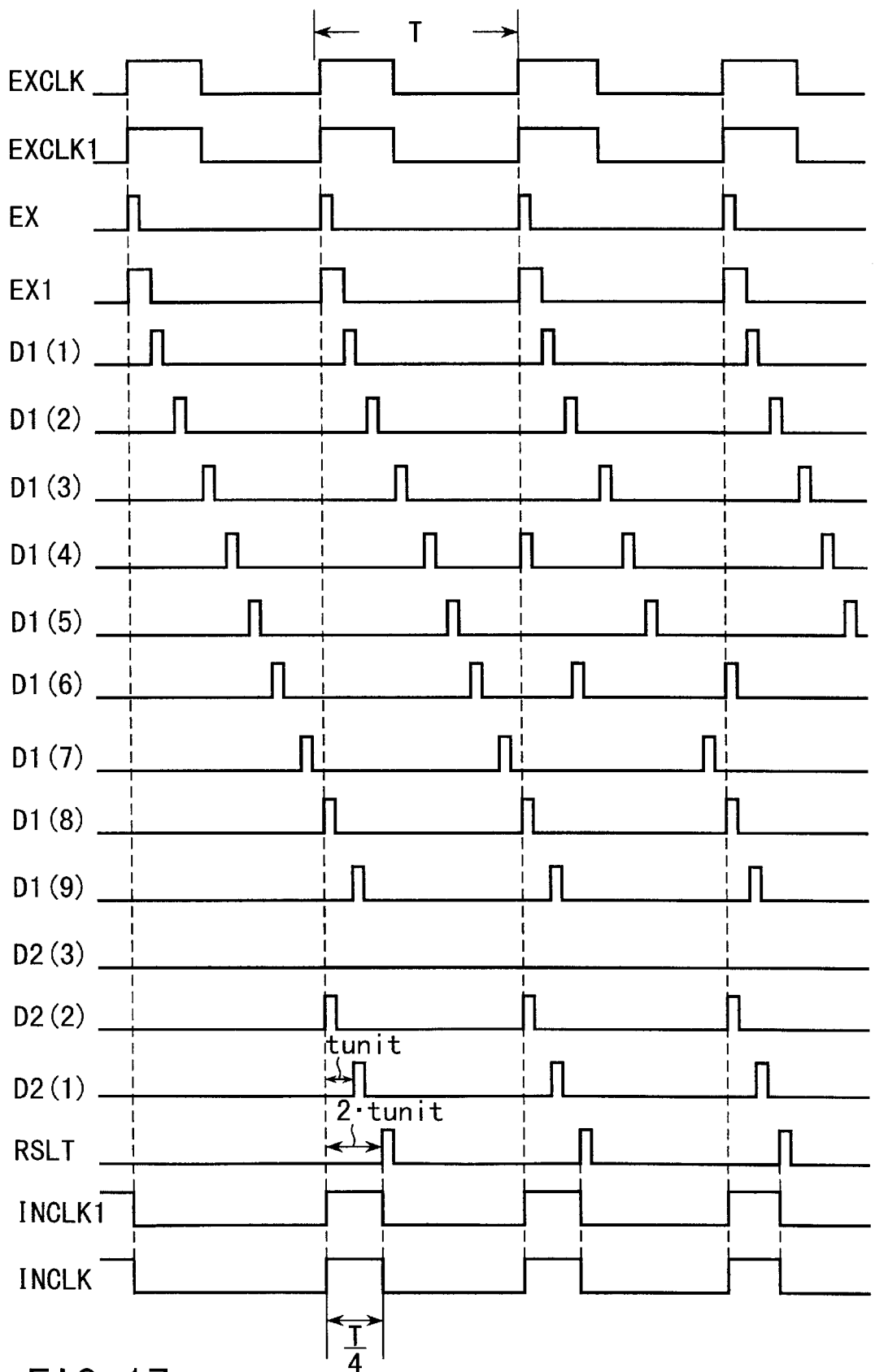
FIG. 17 is a timing chart explaining the operation of the circuit shown in FIG. 16.

The internal clock generating circuit according to the third embodiment operates well even if the pulse signal EX is generated at the falling edge of the external clock signal EXCLK1, not at the rising edge thereof as is shown in FIG. 17.

FIG. 18 shows one of the identical pulse output circuits 14. As shown in FIG. 18, the pulse output circuit 14 comprises a 4-input OR gate 141, an 2-input EXOR gate 142, and an n-channel MOSFET M141. The OR gate 141 receives four output pulses D1(j−2), D1(j−1), D1(j) and D1(j+1) from the cycle measuring circuit 3. The EXOR gate 142 receives the output of the OR gate 141 and the pulse signal EX1. The n-channel MOSFET M141 has a drain connected to receive the pulse signal EX1, a gate connected to the output of the EXOR gate 142 and a source for outputting a pulse D2(j/4). How the circuit 14 operates will be explained below, with reference to the timing chart of FIG. 17.

In the pulse output circuit 14 which has received the pulses D1(2), D1(3), D1(4) and D1(5), all these input pulses are at logic level "0" while the pulse signal EX1 remains at logic level "1." The output of the OR gate 141 is therefore at logic level "0." The output of the EXOR gate 142 is also at logic level "0," whichever logic level the pulse signal EX1 takes. As a result, the MOSFET M141 is turned off, outputting no data to the output terminal D2(1).

Then, in the pulse output circuit 14 which has received the pulses D1(6), D2(7), D1(8) and D1(9), the pulses D1(6), D1(7) and D1(9) are at logic level "0" and the pulse D1(8) is at logic level "1" while the pulse signal EX1 remains at logic level "1." The output of the OR gate 141 is therefore at logic level "1." The output of the EXOR gate 142 is therefore at logic level "1" while the pulse signal EX1 remains at logic level "1." As a result, the MOSFET M141 is turned on, outputting the pulse signal EX1 to the output terminal D2(2).

Thus, each pulse output circuit 14 outputs the pulse signal EX1 when any one of the four inputs D1(j−2), D1(j−1), D1(j) and D1(j+1) takes logic level "1" while the pulse signal EX1 remains at logic level "1", and outputs nothing when the pulse signal EX1 is at logic level "0." The 4-input pulse output circuit 14 may have various structures as each pulse output circuit 6 has as is illustrated in FIGS. 8A to 8D. Furthermore, the third embodiment can generate a clock signal having a duty ratio $2^K \times 100\% \times 100\%$ if a pulse delayed by the cycle T times $2^K$ with respect to the external clock signal is used as the pulse signal EX1.

(Fourth Embodiment)

An internal clock generating circuit according to the fourth embodiment of the invention will now be described. The fourth embodiment is designed to generate two internal clock signals having different duty ratios $1/2^K$, one having a duty ratio of 25% and the other having a duty ratio of 50%.

Figure 19:
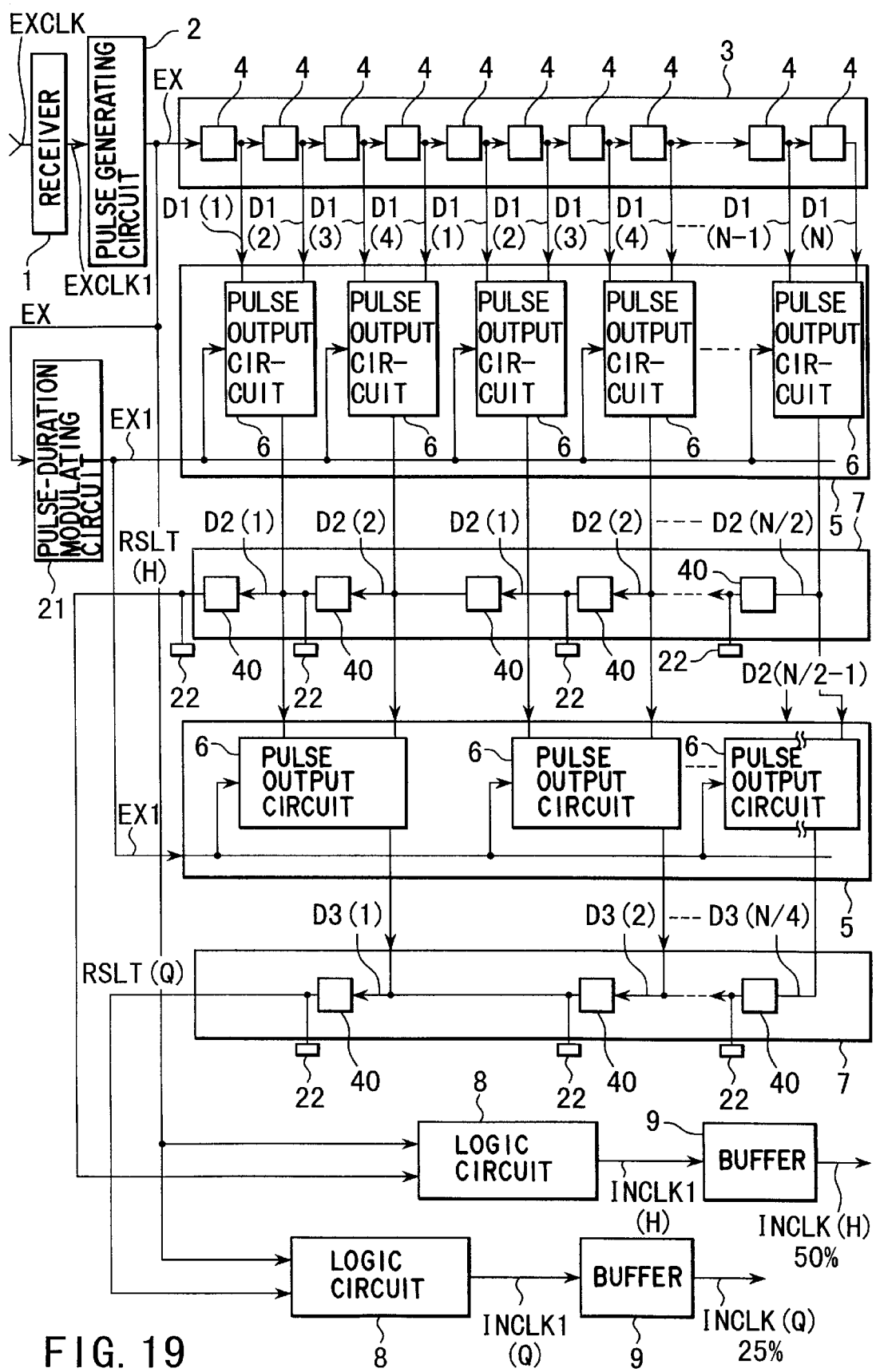
FIG. 19 is a block diagram showing a semiconductor integrated circuit according to a fourth embodiment of the invention.
Figure 20:
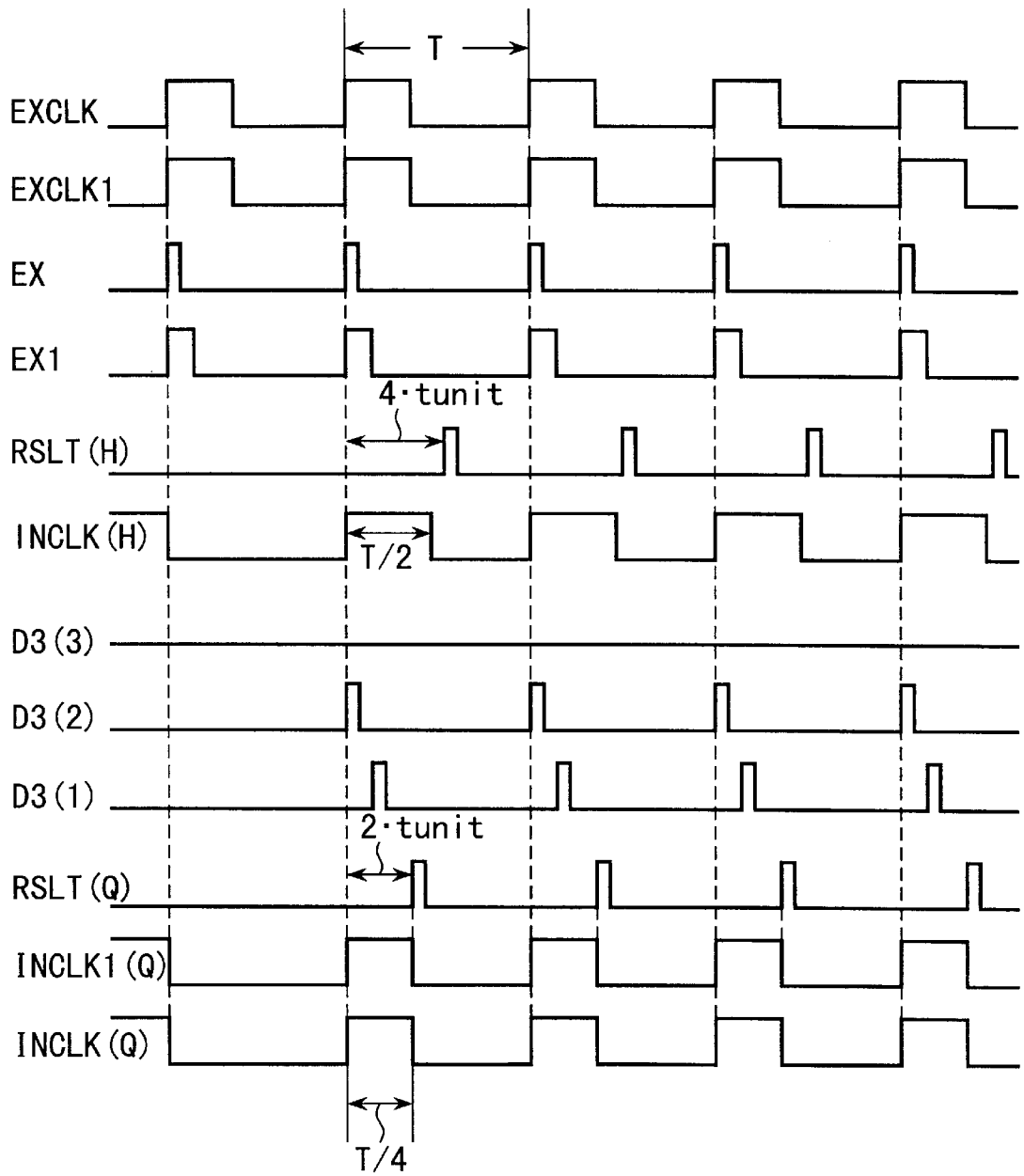
FIG. 20 is a timing chart explaining the operation of the circuit shown in FIG. 19.

FIG. 19 is a block diagram showing the structure of the fourth embodiment, and FIG. 20 is a timing chart explaining the operation of the fourth embodiment. The fourth embodiment is different from the first to third embodiments in that one additional number converting circuit 5, one additional time converting circuit 7, one additional logic circuit 8 and one additional buffer 9 are provided.

The first time converting circuit 7 outputs a pulse signal RSLT(H) which is delayed by T/2 with respect to the pulse signal EX. The second time converting circuit 7 outputs a pulse signal RSLT(Q) which is delayed by T/4 with respect to the pulse signal EX. The second time converting circuit 7 generates the pulse signal RSLT(Q) in a similar way as the converting circuit 7 generates the pulse signal RSLT in the first embodiment. Therefore, how the second time converting circuit 7 generates the pulse signal RSLT(Q) is not explained here.

The logic circuit 8 generates an external clock signal INCLK1(H) having a duty ratio of 50% from the pulse signal EX and the pulse signal RSLT(H). An additional logic circuit 8 generates an external clock signal INCLK1(Q) having a duty ratio of 25% from the pulse signal EX and the pulse signal RSLT(Q).

The fourth embodiment can thus generate two internal clock signals having a duty ratio of 25% and a duty ratio of 50%, respectively. Needless to say, more internal clock signals having different duty ratios can be generated, by using more additional number converting circuits 5, more time converting circuits 7, more logic circuits 8, and more buffers circuit 9.

(Fifth Embodiment)

An internal clock generating circuit according to the fourth embodiment of the invention will now be described. The fifth embodiment is designed to generate an internal clock signal INCLK which has a duty ratio of $2^{-K} \times 100\%$ and which is in phase with the external clock signal EXCLK, in spite of the delay times of the receiver 1, pulse generating circuit 2, logic circuit 8 and buffer 9—all shown in FIG. 3.

Figure 21:
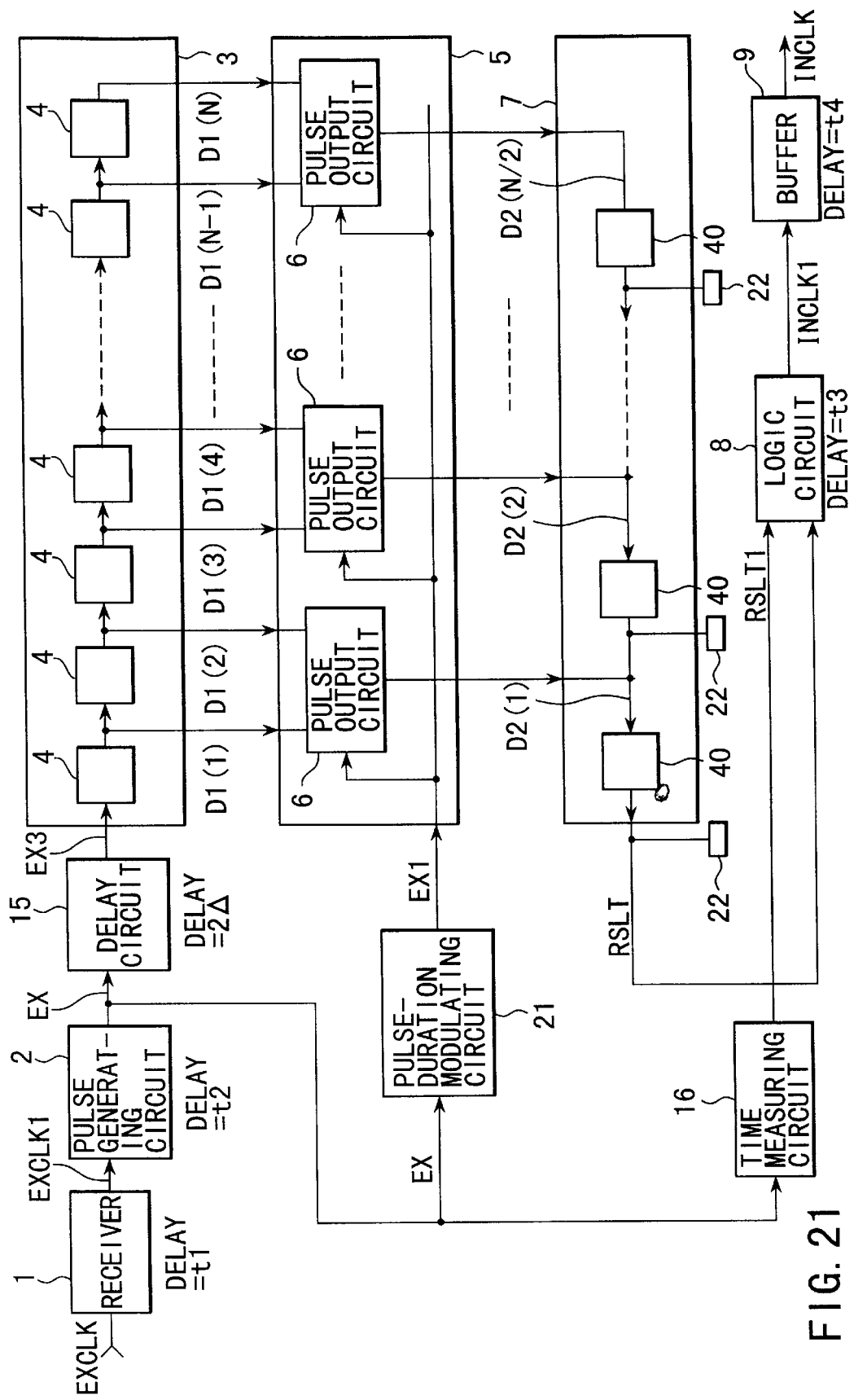
FIG. 21 is a block diagram showing a semiconductor integrated circuit according to a fifth embodiment of the invention.
Figure 22:
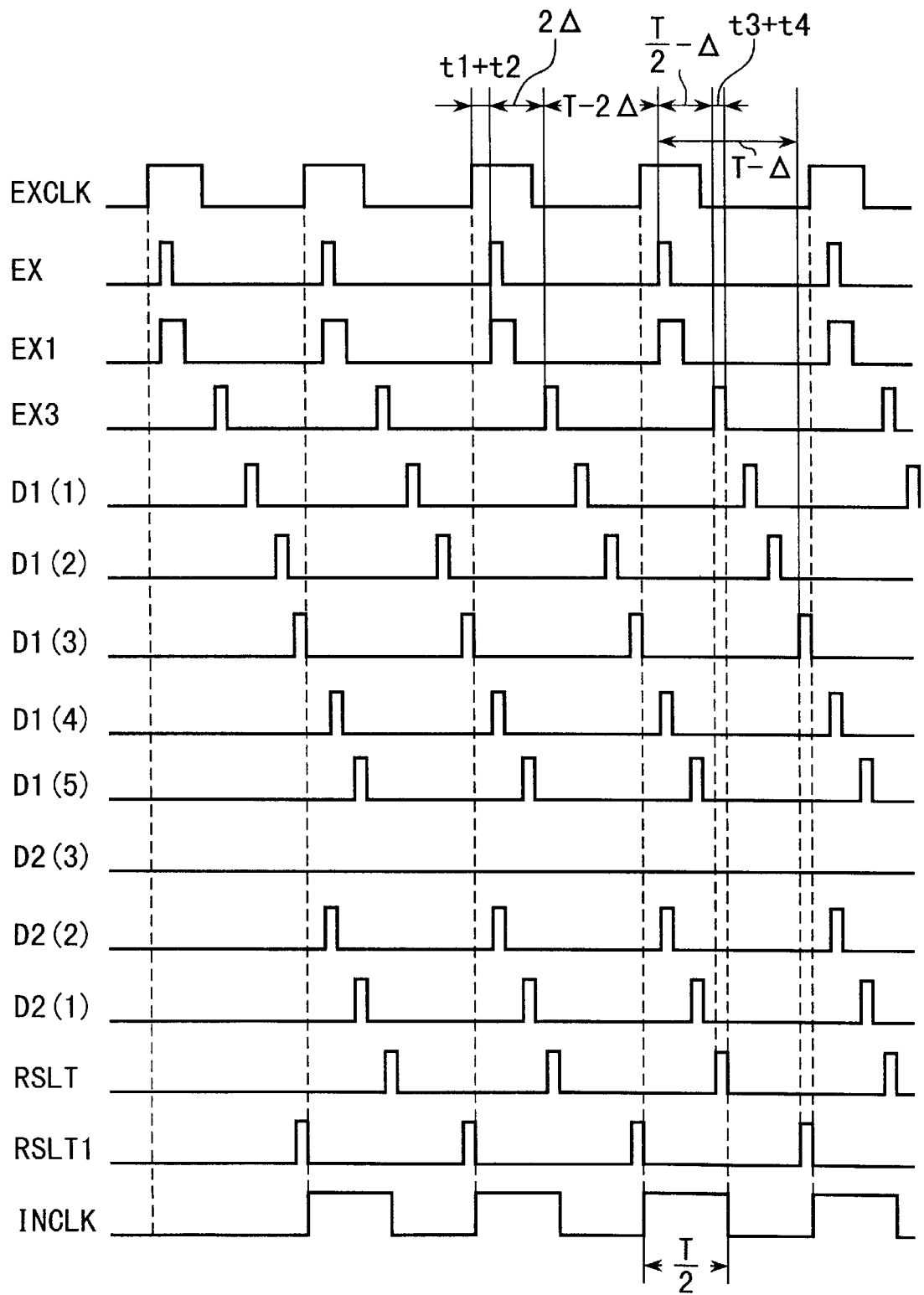
FIG. 22 is a timing chart explaining the operation of the circuit shown in FIG. 21.

FIG. 21 is a block diagram showing the structure of the fifth embodiment, and FIG. 22 is a timing chart explaining the operation of the fifth embodiment. The fifth embodiment is different from the first embodiment in that two additional components are provided. The first additional component is a delay circuit 15, and the second additional component is time measuring circuit 16. In the fifth embodiment, the receiver 1, pulse generating circuit 2, logic circuit 8 and buffer 9 have delay time t1, delay time t2, delay time t3, and delay time t4, respectively.

How the fifth embodiment operates when an external clock signal EXCLK is input to it which has a cycle T and a duty ratio of 33% will be explained, with reference to the timing chart of FIG. 22. In the fifth embodiment, the number converting circuit 5 is controlled by a pulse signal EX.

Since the receiver 1 and pulse generating circuit 2 has delay time t1 and delay time t2, the pulse signal EX output from the circuit 2 is delayed by t1+t2 with respect to the rising edge of the external clock signal EXCLK. The signal EX is supplied to the delay circuit 15, which outputs a pulse signal EX3. The signal EX3 is delayed by delayed t1+t2+2Δ with respect to the external clock signal EXCLK. This is because the delay circuit 15 has a delay time 2Δ. Here, 2Δ=2(t1+t2+t3+t4). The pulse signal EX3 is input to the cycle measuring circuit 3 and passes through the delay line provided in the circuit 3. The delay elements 4 provided in the circuit 3 generates a signal which is in phase with the input signal and have a delay time $t_{unit}$.

As seen from FIG. 22, $t_{unit}$=T/6. Hence, the outputs D1(1) to D1(5) of the delay elements 4 are delayed by $t_{unit}$, $2 \times t_{unit}$, $3 \times t_{unit}$, $4 \times t_{unit}$ and $5 \times t_{unit}$, respectively, with respect to the pulse signal EX3. The least natural number i satisfying the condition that any one of the two outputs D1(i) and D1(i+1) which the cycle measuring circuit 3 generates in response to the pulse signal EX3 is a parameter representing the cycle T the circuit 3 should measure. In other words, the number i represents the cycle T when the output D1 of the circuit 3 and the pulse signal EX1 (=EX) are at logic level "1." Since the pulse signal EX3 is delayed by 2Δ with respect to the pulse signal EX, the cycle the circuit 3 measures is T−2Δ. In the instance of FIG. 22, i=4.

The number converting circuit 5 converts the number 1 to i/2. In the circuit 5, the pulse signal EX1(=EX) is applied to the output pulse D2(i/2). The pulse D2(i/2) is input to the (i/2)th delay element 40 of the time converting circuit 7 and passes through the delay line provided in the circuit 7. Since i=4, the pulse D2(3) does not change, and the pulse D2(2) rises at the same time as the pulse D1(4). Each output pulse of the circuit 5 is delayed by $t_{unit}$ with respect to the pulse signal EX. As a result, the output pulse signal RSLT of the circuit 7 is delayed by (T−2Δ)/2 (=T/2−Δ) with respect to the pulse signal EX.

The time measuring circuit 16 generates a pulse signal RSLT1 which is delayed by T−Δ with respect to the pulse signal EX. The logic circuit 8 generates an internal clock signal INCLK1 which changes when either the pulse signal RSLT1 or the signal RSLT takes logic level "1." The sum of the delay times of the logic circuit and buffer 9 is t3+t4. Therefore, the internal clock signal INCLK output from the buffer 9 is in phase with the external clock signal EXCLK and has a duty ratio of 50%. Thus, if incorporated in a synchronous LSI, the fifth embodiment will help to prevent signal-transfer errors in the LSI and, ultimately, enhance the operating efficiency of the synchronous LSI.

The delay time 2Δ (Δ=t1+t2+t3+t4) is imparted to the delay circuit 15 in order to set the internal clock signal INCKL in phase with the external clock signal EXCLK, though the clock signal INCLK has been delayed with respect to the external clock signal EXCLK. The internal clock signal INCLK is delayed by $D_{time}$, for its half cycle, with respect to the external clock signal EXCLK. The delay $D_{time}$ is given as follows:

$$D_{time}=t1+t2+2\Delta+T-2\Delta+(T/2)-\Delta+t3+t4$$

If Δ is substituted by t1+t2+t3+t4, the above equation reduces to:

$$D_{time}=(3/2)T$$

The internal clock generating circuit according to the fifth embodiment operates well even if the pulse signal EX is generated at the falling edge of the external clock signal EXCLK, not at the rising edge thereof as is shown in FIG. 22. The delay time elements 4 and 40 may be those which generate a pulse opposite in phase to the input pulse. In this case, too, the fifth embodiment can generate an internal clock signal INCLK which has a duty ratio of $2^{-K} \times 100\%$. Further, the phase difference between the external and internal clock signals, which has been made in each pulse output circuit 6, can be eliminated by delaying the pulse signal EX1 with respect to the pulse signal EX by the delay time of the pulse output circuit 6.

As indicated above, any embodiment of the invention, described above, can generate an internal clock signal having a desired duty ratio from an external clock signal having any duty ratio. The circuit can therefore be used as a clock delivery LSI in a synchronous LSI, for supplying an operating clock signal to various LSIs provided outside the synchronous LSI.

A specific use of the internal clock signal generating circuit according to the invention will be explained with reference to FIG. 23.

Figure 23:
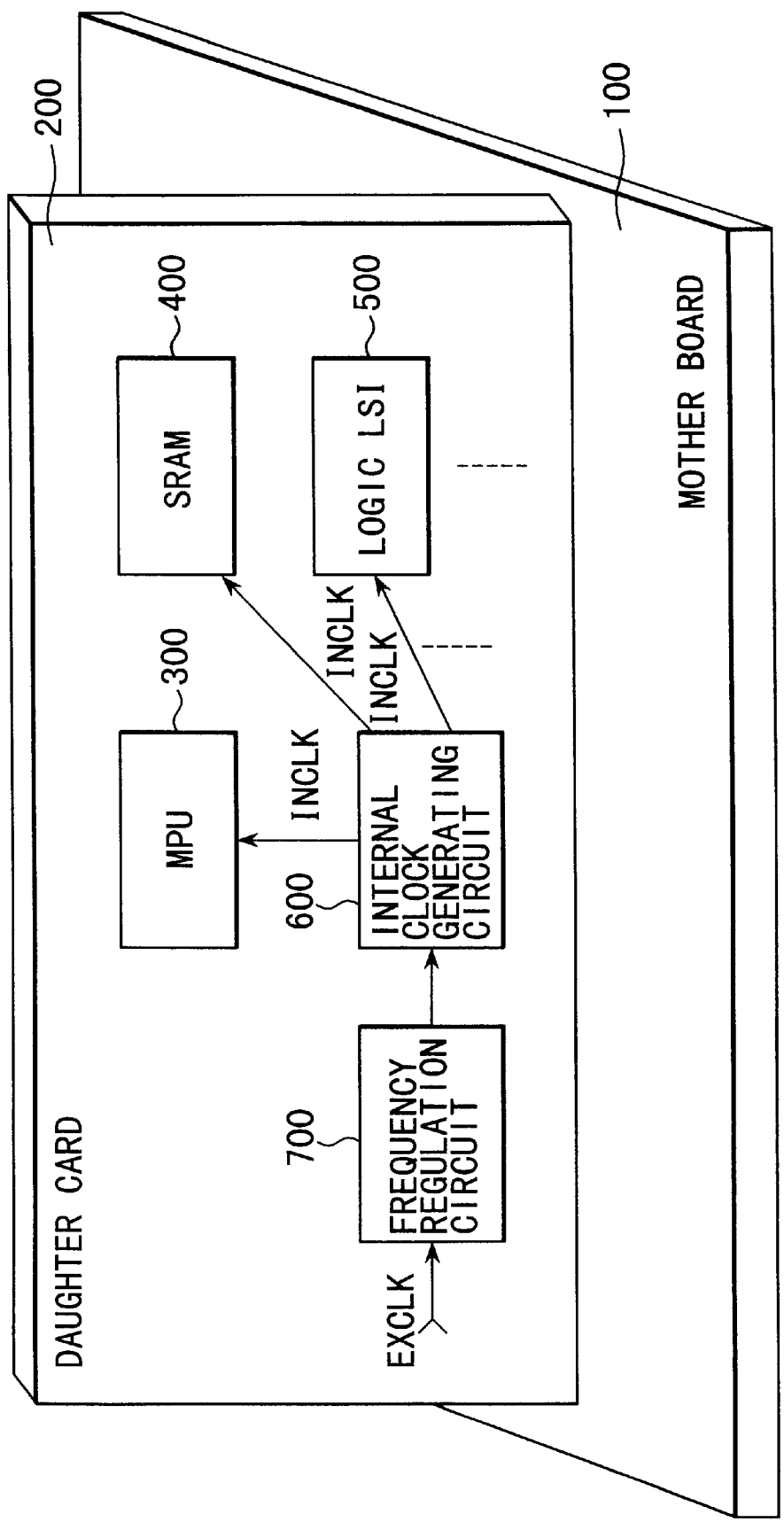
FIG. 23 is a perspective view of a mother board and a daughter board, explaining a specific use of a semiconductor integrated circuit according to the invention.

FIG. 23 shows an information apparatus such as a computer. The apparatus comprises a mother board 100 and a daughter board 200. The daughter board 200 is attached to the mother board 100 by a socket (not shown) or the like. Synchronous LSIs, such as a processor, memories and the like, are mounted on the daughter board 200 so that the information apparatus may operate at high speed.

More precisely, an MPU 300, a synchronous SRAM 400, a logic LSI 500, a clock delivery LSI 600, and a frequency regulation circuit 700 are mounted on the daughter board 200. The clock delivery LSI 600 is one of the embodiments of the invention, which have been described above.

A clock oscillator (not shown) is mounted on the mother board 200. The clock oscillator generates a system clock signal. The system clock signal is supplied as external clock signal EXCLK, either directly to the clock delivery LSI 600 or indirectly thereto through the frequency regulation circuit 700. The clock delivery LSI 600 generates an internal clock signal INCLK from the external clock signal EXCLK. The internal clock signal INCLK thus generated is in phase with the external clock signal EXCLK and has a desired duty ratio. The internal clock signal INCLK is supplied as an operating clock signal to the MPU 300, synchronous SRAM 400 and logic LSI 500.

Three clock delivery LSIs need not be provided for the MPU 300, synchronous SRAM 400 and logic LSI 500, respectively. Only one clock delivery LSI suffices to help increase the operating efficiency of the three LSIs.

In any of the embodiments described above, the logic gates may be pass-gate logic ones. Furthermore, the semiconductor integrated circuit according to the present invention can be modified in various ways, without departing from the spirit of the invention.

As has been described above, the present invention can provide a semiconductor integrated circuit which can generate from an external clock signal of any other duty ratio an internal clock signal which has a desired duty ratio of $2^{-K} \times 100\%$ (K is a natural number) and which is in phase with the external clock signal. The circuit may be used in a double-edge synchronous LSI in which the rising edge and falling edge of a clock signal are both utilized as triggers. If so, the circuit will serve to enhance the operating frequency of the double-edge synchronous LSI.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A clock converting circuit for converting a primary clock signal having any duty ratio to a secondary clock signal having a duty ratio of $(1/2^K) \times 100\%$, where K is a natural number, said circuit comprising:

a pulse generating circuit for generating a first pulse signal having the same cycle as, and a duration different from, the primary clock signal;

a cycle measuring circuit for measuring a cycle of the first clock pulse signal, which is approximately m times a unit time, the cycle measuring circuit having a plurality of first delay elements connected in cascade;

a number converting circuit for multiplying m by $1/2^K$;

a time converting circuit for generating a second pulse signal having substantially the same cycle as the first pulse signal and delayed with respect to the first pulse signal by a time which is $m/2^K$ times the unit time, the time converting circuit having a plurality of second delay elements connected in cascade, each of said second delay elements corresponding to two or more first delay elements; and a logic circuit for generating the second clock signal from the first pulse signal and the second pulse signal, said secondary clock signal rising in synchronism with the first pulse signal and falling in synchronism with the second pulse signal.

2. A clock converting circuit according to claim 1, wherein the first and second delay elements have a delay time equal to the unit time.

3. A clock converting circuit according to claim 2, wherein the first delay elements and the second delay elements are arranged on a semiconductor chip, and the cascade of the second delay elements extends parallel to the cascade of the first delay elements.

4. A clock converting circuit according to claim 3, wherein the second delay elements are arranged to transfer signals in a direction opposite to a direction in which the first delay elements transfer signals.

5. A clock converting circuit according to claim 3, wherein the second delay elements are provided in a number $1/2^K$ times the number of the first delay elements.

6. A clock converting circuit according to claim 3, wherein each of the second delay elements is associated with adjacent $2^K$ first delay elements and connected thereto by the number converting circuit.

7. A clock converting circuit according to claim 3, wherein the number converting circuit has pulse output circuits in the same number as the second delay elements, and each of the pulse output circuit is connected to outputs of adjacent $2^K$ first delay elements and an output of the pulse generating circuit, for outputting a pulse to an associated one of the second delay elements when an output of any one of the adjacent $2^K$ first delay elements and the first pulse signal output from the pulse generating circuit are at logic "1" level.

8. A clock converting circuit according to claim 7, further comprising a pulse-duration modulating circuit for modulating a duration of the first pulse signal and supplying to the pulse output circuits the first pulse signal having a duration modulated.

9. A clock converting circuit according to claim 8, wherein the pulse-duration modulating circuit modulates the duration of the first pulse signal so that the sum of the modulated duration of the first pulse signal and the duration of a pulse output from any first delay element is greater than the unit time.

10. A clock converting circuit according to claim 8, wherein the pulse-duration modulating circuit modulates the duration of the first pulse signal so that the modulated duration of the first pulse signal is less than the unit time.

11. A clock converting circuit according to claim 7, further comprising a plurality of dummy load elements connected to the outputs of the second delay elements, respectively, and having a capacitance equal to the difference between the input capacitance and output capacitance of each pulse output circuit.

12. A clock converting circuit for converting a primary clock signal having any duty ratio to a secondary clock signal having a duty ratio of $(1/2^K) \times 100\%$ and to a tertiary clock signal having a duty ratio of $(1/2^{K+1}) \times 100\%$, where K is a natural number, said circuit comprising:

a pulse generating circuit for generating a first pulse signal having the same cycle as, and a duration different from, the primary clock signal;

a cycle measuring circuit for measuring a cycle of the first clock pulse signal, which is approximately m times a unit time;

a first number converting circuit for multiplying m by $1/2^K$;

a second number converting circuit for multiplying m by $1/2^{K+1}$;

first time converting circuit for generating a second pulse signal having substantially the same cycle as the first pulse signal and delayed with respect to the first pulse signal by a time which is $m/2^K$ times the unit time;

second time converting circuit for generating a third pulse signal having substantially the same cycle as the first pulse signal and delayed with respect to the first pulse signal by a time which is $m/2^{K+1}$ times the unit time;

a first logic circuit for generating the secondary clock signal from the first pulse signal and the second pulse signal, said secondary clock signal rising in synchronism with the first pulse signal and falling in synchronism with the second pulse signal; and a second logic circuit for generating the tertiary clock signal from the first pulse signal and the third pulse signal, said tertiary clock signal rising in synchronism with the first pulse signal and falling in synchronism with the third pulse signal.

13. A clock converting circuit for converting a primary clock signal having any duty ratio to a secondary clock signal which is in phase with the primary clock signal and which has a duty ratio of $(1/2^K) \times 100\%$, where K is a natural number, said circuit comprising:

a pulse generating circuit for generating a first pulse signal having the same cycle as the primary clock signal and delayed by a first delay time with respect to the primary clock signal;

a delay circuit for delaying the first pulse signal by twice a second delay time, thereby generating a second pulse signal;

a cycle measuring circuit for measuring a period between the first pulse signal and the second pulse signal, which is m times a unit time;

a number converting circuit for multiplying m by $1/2^K$;

time converting circuit for generating a third pulse signal having substantially the same cycle as the first pulse signal and delayed with respect to the first pulse signal by a time which is m times the unit time;

a circuit for generating a fourth pulse having substantially the same cycle as the first pulse signal and delayed with respect to the first pulse signal by a difference between the cycle of the first pulse signal and the second delay time;

a logic circuit for generating the secondary clock signal from the third pulse signal and the fourth pulse signal, said secondary clock signal rising in synchronism with the fourth pulse signal and falling in synchronism with the third pulse signal; and a buffer for outputting the secondary clock signal, said buffer having such a delay time that a sum of the delay time of the logic circuit, the delay time of the buffer and the first delay time is substantially equal to the second delay time.

14. A clock converting circuit circuit for converting a primary clock signal having any duty ratio to a secondary clock signal having a duty ratio of 50%, said circuit comprising:

a pulse generating circuit for generating a first pulse signal having the same cycle as, and a duration different from, the primary clock signal;

an N number of first delay elements connected to an output of the pulse generating circuit, and connected in cascade;

an (N/2) number of pulse output circuits, each connected to outputs of two adjacent first delay elements and the output of the pulse generating circuit, for generating a pulse when an output of any one of the two adjacent first delay elements and an output of the pulse generating circuit are at logic level "1";

an (N/2) number of second delay elements connected to outputs of the pulse output circuits, respectively, connected in cascade and having substantially the same delay time as the first delay elements, the pulse signal output from each of the pulse output circuits being output through m/2 second delays as a second pulse signal, where m is the number of first delay elements associated with the pulse signal output from each of the pulse output circuits;

a logic circuit for generating the secondary clock signal from the first pulse signal and the second pulse signal, said secondary clock signal rising in synchronism with the first pulse signal and falling in synchronism with the second pulse signal.

* * * * *